(12) United States Patent
Komatsu et al.

(10) Patent No.: US 9,316,702 B2
(45) Date of Patent: Apr. 19, 2016

(54) MAGNETIC-FIELD DETECTION MICROCOMPUTER AND MAGNETIC-FIELD DETECTING METHOD

(71) Applicant: PANASONIC CORPORATION, Osaka (JP)

(72) Inventors: Shigeyuki Komatsu, Kyoto (JP); Hideo Tomita, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 743 days.

(21) Appl. No.: 13/750,589

(22) Filed: Jan. 25, 2013

(65) Prior Publication Data

US 2013/0138374 A1   May 30, 2013

Related U.S. Application Data

(63) Continuation of application No. PCT/JP2011/003762, filed on Jun. 30, 2011.

(30) Foreign Application Priority Data

Jul. 30, 2010   (JP) .................. 2010-173025

(51) Int. Cl.
*G01R 33/02*   (2006.01)
*G01R 33/07*   (2006.01)
(Continued)

(52) U.S. Cl.
CPC ............ *G01R 33/02* (2013.01); *G01R 33/0023* (2013.01); *G01R 33/07* (2013.01); *G01R 33/072* (2013.01); *G06F 17/00* (2013.01); *H01L 27/22* (2013.01)

(58) Field of Classification Search
CPC ...... G01R 33/02; G01R 33/07; G01R 33/072; G01R 33/0023; H01L 27/22; G06F 17/00
See application file for complete search history.

(56) References Cited

U.S. PATENT DOCUMENTS 5,206,580 A * 4/1993 Okamoto ............... H02P 9/305
                                                                  322/28
5,956,197 A * 9/1999 Le ............................ G11B 5/02
                                                                  360/46

(Continued)

FOREIGN PATENT DOCUMENTS

CN      1456860 A    11/2003
JP      3-261869 A   11/1991

(Continued)

OTHER PUBLICATIONS

J. Zhang et al., "The Development of Intelligent Magnetic Field Measuring Apparatus with Replaceable Probe," The Application of Electronic Technology, Version 11, Dec. 31, 2004, pp. 38-40, with English translation.

(Continued)

*Primary Examiner* — Alexander Satanovsky
*Assistant Examiner* — John Kuan
(74) *Attorney, Agent, or Firm* — McDermott Will & Emery LLP

(57) ABSTRACT

A magnetic-field detection microcomputer includes: a magnetic-field detection device; a differential amplifier; a variable voltage circuit which generates a reference voltage that is variable; a comparator which compares an output from the differential amplifier with the reference voltage; a register which outputs a voltage control value to the variable voltage circuit; a ROM which previously store a first table in which a magnetic-field intensity and the voltage control value are associated with each other; and a CPU which sets, to the register, the voltage control value, and determines presence or absence of the magnetic-field intensity associated with the voltage control value based on a result of the comparison by the comparator and the first table.

11 Claims, 24 Drawing Sheets

(51) Int. Cl.
    *G06F 17/00*     (2006.01)
    *G01R 33/00*     (2006.01)
    *H01L 27/22*     (2006.01)

(56) References Cited

U.S. PATENT DOCUMENTS

| | | |
|---|---|---|
| 6,940,274 B2 | 9/2005 | Wakiyama et al. |
| 7,659,716 B2 | 2/2010 | Nishikawa |
| 7,956,598 B2 | 6/2011 | Ariyama |
| 2004/0075426 A1 | 4/2004 | Wakiyama et al. |
| 2008/0048772 A1 | 2/2008 | Nishikawa |
| 2009/0079411 A1 | 3/2009 | Ariyama |
| 2009/0128131 A1 | 5/2009 | Kobayashi |

FOREIGN PATENT DOCUMENTS

| | | |
|---|---|---|
| JP | 2006-038799 A | 2/2006 |
| JP | 2006-098306 A | 4/2006 |
| JP | 2008-032424 A | 2/2008 |
| JP | 2009-047478 A | 3/2009 |
| JP | 2009-048539 A | 3/2009 |

OTHER PUBLICATIONS

Chinese Office Action issued in Chinese Application No. 201180033356I.X dated Aug. 5, 2014, with partial English translation.

International Search Report issued in International Patent Application No. PCT/JP2011/003762 mailed Oct. 4, 2011.

\* cited by examiner

FIG. 2A

| Magnetic-field detection determination table ||
|---|---|
| Inputting magnetic field | Set value in register 4B |
| Magnetic-free field X[mT] ⋮ Y[mT] Z[mT] | Initial value N X1 ⋮ Y1 Z1 |

FIG. 2B

| Magnetic-field detection determination table ||
|---|---|
| Inputting magnetic field | Set value in register 4B |
| Magnetic-free field −X[mT] ⋮ −Y[mT] −Z[mT] | Initial value N X2 ⋮ Y2 Z2 |

| Magnetic-field detection determination table | | |
|---|---|---|
| Inputting magnetic field | Set value in register 4B | Set value in register 4A |
| Magnetic-free field X[mT] ⋮ Y[mT] Z[mT] | Initial value N X3 ⋮ Y3 Z3 | G1 |
| ⋮ | ⋮ | G2 |
| ⋮ | ⋮ | G3 |
| ⋮ | ⋮ | ⋮ |

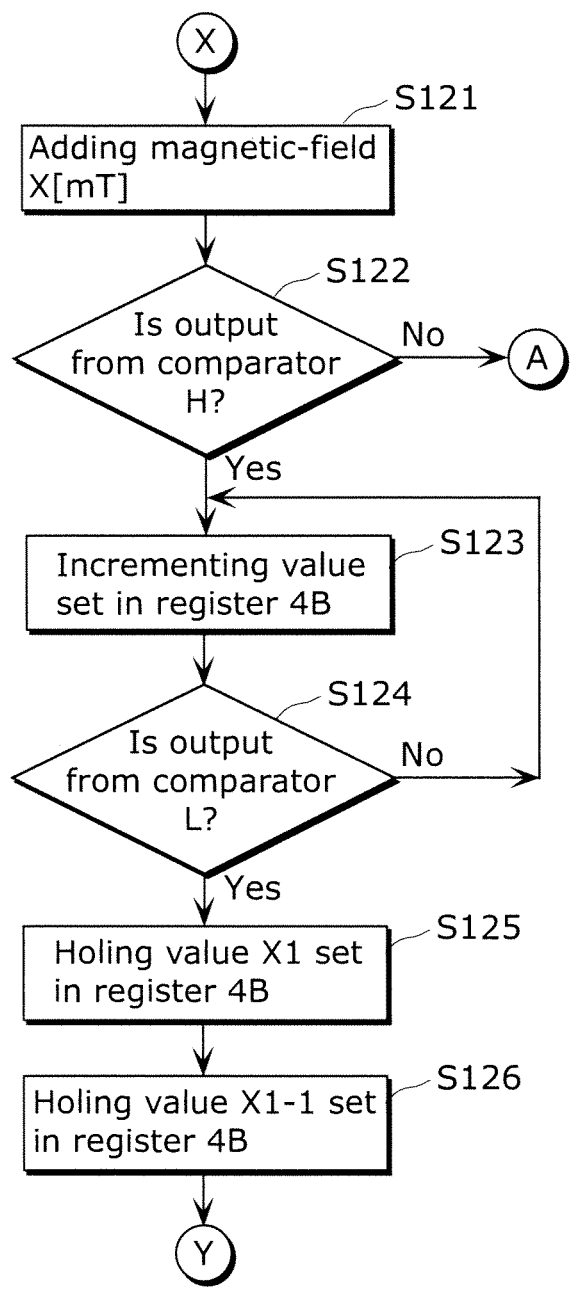

MAGNETIC-FIELD DETECTION MICROCOMPUTER AND MAGNETIC-FIELD DETECTING METHOD

CROSS REFERENCE TO RELATED APPLICATION

This is a continuation application of PCT International Application No. PCT/JP2011/003762 filed on Jun. 30, 2011, designating the United States of America, which is based on and claims priority of Japanese Patent Application No. 2010-173025 filed on Jul. 30, 2010. The entire disclosures of the above-identified applications, including the specifications, drawings and claims are incorporated herein by reference in their entirety.

FIELD

The present invention relates to a magnetic-field detection microcomputer having a function for detecting a magnetic field, and to a magnetic-field detecting method.

BACKGROUND

In recent years, an integration degree in a large-scale integration (LSI) system has increased year by year along with sophistication in a system and finely-divided processes. Reflecting this, an equipment system which conventionally includes a plurality of chips are currently being made into a single chip. However, it is particularly difficult for an analog block having a sensor system to be made into a single chip. In the analog block having a sensor system, a fine analog signal is processed. Accordingly, a semiconductor process which requires a sensor to increase its susceptibility and a process for improving the fine-division at a low cost are not necessarily the same process.

For example, FIG. 21 shows a sensor integrated circuit (IC) and a microcomputer in a conventional technique. FIG. 21 shows an example which includes two chips, such as a sensor ICX and a microcomputer Y, an output terminal X3 for outputting a signal from the sensor ICX, and an input terminal X4 for inputting a signal into the sensor ICX, and the output terminal X3 and the input terminal X4 are connected to the microcomputer Y via a signal line (See Patent Literature 1, for example).

FIG. 22 is a diagram which shows a magnetic-field detection circuit according to a conventional technique. As shown in FIG. 22, processing described below is performed for improving temperature characteristics of the sensor IC. An output OUTA from a hall element HAL1, which is amplified by an amplifier circuit AMP1, is inputted in a comparator circuit CMP1. In addition, a voltage reference circuit BL1 includes only a voltage divider circuit which generates reference voltages VTH1 and VTH2, and performs temperature compensation. One of the reference voltages VTH 1 and VTH2 generated in the voltage reference circuit BL1, which has a temperature coefficient approximately equal to that of the output OUTA, is selected by a switching circuit SW1, and the selected reference voltage is inputted in the comparator circuit CMP1 as a reference voltage OUTB.

The comparator circuit CMP1 compares the output OUTA and the reference voltage OUTB so as to detect the magnetic field. Specifically, a circuit is added which includes the switch circuit SW1 and the reference voltage circuit BL1 and cancels the temperature characteristics of the output OUTA, as shown in FIG. 22. Patent Literature 2, for example, discloses a method used for improving performance of the individual sensor IC, using the above configuration. In the following description, a technique disclosed in Patent Literature 2 is also referred to as a conventional technique B.

CITATION LIST

Patent Literature

[Patent Literature 1] Japanese unexamined patent application publication No. 2008-032424 (page 29, FIG. 19)
[Patent Literature 2] Japanese unexamined patent application publication No. 2009-047478 (page 10, FIGS. 3 and 4)

SUMMARY

Technical Problem

However, a conventional technique B requires a variable voltage circuit (reference voltage circuit BL1) which is configured by combining resistors having two or more types of temperature characteristic coefficients for cancelling the temperature characteristics, and generates two types of reference voltages. This causes the configuration of the variable voltage circuit according to the conventional technique B to be complicated.

Although Patent Literature 1 discloses a case in which a sensor IC and a microcomputer are combined, no technique is disclosed for easily determining presence or absence of a magnetic-field intensity.

The present invention solves the above conventional problem, and an object of the present invention is to provide a magnetic-field detection microcomputer capable of easily determining the presence or absence of the magnetic-field intensity without a complicatedly-configured variable voltage circuit, and a method for detecting the magnetic-field.

Solution to Problem

A magnetic-field detection microcomputer according to an aspect of the present invention for solving the problem includes: a magnetic-field detection device which detects a magnetic field; a differential amplifier which amplifies an output voltage from the magnetic-field detection device; a variable voltage circuit which generates, according to a voltage control signal, a reference voltage that is variable; a comparator which compares an output from the differential amplifier with the reference voltage generated by the variable voltage circuit; a voltage controlling register which holds a voltage control value for controlling a level of the reference voltage generated by the variable voltage circuit, and outputs the voltage control signal having the voltage control value to the variable voltage circuit; a storage unit configured to previously store a first table in which a magnetic-field intensity indicating an intensity of the magnetic field to be applied to the magnetic-field detection device and the voltage control value are associated with each other; and a central processing unit (CPU) configured to set, to the voltage controlling register, the voltage control value corresponding to a magnetic field to be detected, and to determine presence or absence of the magnetic-field intensity associated with the voltage control value based on a result of the comparison by the comparator and the first table.

With this configuration, simple processing makes it possible to determine the presence or absence of the magnetic-field intensity associated with the voltage control value. In the simple processing, the voltage control value and the magnetic-field intensity are previously stored in the storage unit, and the voltage control value corresponding to the magnetic field to be detected is set in the voltage controlling register. Therefore, the presence or absence of the magnetic-field intensity associated with the voltage control value can be easily determined.

A conventional variable voltage circuit has a configuration in which two types of reference voltages are generated. However, the variable voltage circuit of the magnetic-field detection microcomputer according to an aspect of the present invention is configured to generate a single reference voltage. Accordingly, a configuration of the variable voltage circuit of the magnetic-field detection microcomputer according to the aspect of the present invention can be simplified. Therefore, the variable voltage circuit having a complicated configuration is not needed, and the presence or absence of the magnetic-field intensity can be easily determined.

The magnetic-field detection microcomputer may further include a gain controlling register which holds one or more gain control values each for setting a gain of the differential amplifier, and output a gain control signal having a corresponding one of the gain control values to the differential amplifier, in which the differential amplifier may be capable of varying the gain according to the gain control signal, and the storage unit may be configured to previously store the first table in which the magnetic-field intensity and the voltage control value are associated with each other, for each of the gain control values.

With this configuration, the susceptibility for detecting the magnetic field can be controlled by setting a gain.

The CPU may be configured to increase or decrease the voltage control value held in the voltage controlling register, and to read out the magnetic-field intensity associated with the voltage control value from the first table as the detected magnetic-field intensity, when an output from the comparator is inverted.

With this configuration, the magnetic-field intensity in a wide range can be accurately detected.

The variable voltage circuit may be a digital-to-analog (D/A) converter.

With this configuration, the D/A converter included in a usual microcomputer is used as the variable voltage circuit, so that a circuit size can be reduced.

The storage unit may be further configured to previously store: (i) a second table in which an intensity of a magnetic-field in a south pole to be applied to the magnetic-field detection device and the voltage control value indicating a condition under which the output from the comparator is inverted, are associated with each other; and (ii) the first table in which an intensity of a magnetic-field in a north pole to be applied to the magnetic-field detection device and the voltage control value indicating the condition under which the output from the comparator is inverted, are associated with each other.

With this configuration, a direction of the magnetic-field (polarity) can be detected in addition to the magnetic-field intensity.

The CPU may be configured to alternately perform magnetic-field detection using the first table and magnetic-field detection using the second table, a predetermined number of times for each of the magnetic-field detection.

With this configuration, the determination for the presence or absence of the magnetic-fields in different directions (polarities) can alternately be performed efficiently in a time-shared manner, a predetermined number of times for each determination.

The magnetic-field detection microcomputer may further includes: a voltage-raising circuit which raises a power-supply voltage; and a voltage-switching circuit which selects one of the power-supply voltage in which the voltage is raised and the power-supply voltage in which the voltage is not raised, so as to supply the selected power-supply voltage to the magnetic-field detection device, in which the storage unit may be configured to previously store the first table in which the magnetic-field intensity and the voltage control value are associated with each other, for each of the power-supply voltage in which the voltage is raised and the power-supply voltage in which the voltage is not raised, and the CPU may be configured to detect the magnetic-field intensity using the voltage control value corresponding to the power-supply voltage selected by the voltage-switching circuit.

With this configuration, selection between the power-supply voltage in which the voltage is raised and the power-supply voltage in which the voltage is not raised switches the susceptibility of the magnetic-field detection device.

The magnetic-field detection device may be a hall element, and the magnetic-field detection device, the differential amplifier, the variable voltage circuit, the comparator, the voltage controlling register, the storage unit, and the CPU may be formed in a single semiconductor substrate.

With this configuration, the magnetic-field detection device, the amplifier, the variable voltage circuit, the comparator, the voltage controlling register, the storage unit, and the CPU can be achieved in the single semiconductor substrate with a single process, thereby reducing an area for the substrate and a cost.

The hall element may be formed in at least one corner among four corners of the semiconductor substrate.

With this configuration, the hall element is placed in at least one corner among four corners of the semiconductor substrate which are free spaces, thereby reducing a circuit area. In addition, an area where a circuit other than the hall element can be formed can be increased.

The magnetic-field detection microcomputer may further includes: three magnetic-field detection devices each having the same configuration as a configuration of the magnetic-field detection device; and three sets each having the same configuration as a configuration of a set which includes the differential amplifier, the variable voltage circuit and the comparator, in which the four magnetic-field detection devices may be placed in the respective four corners of the semiconductor substrate, and the CPU may be configured to detect the magnetic field using the four sets.

With this configuration, the magnetic-field detection device is placed in each one of the diagonal four corners of the semiconductor substrate, thereby detecting the direction of the magnetic-field susceptibly.

A magnetic-field detecting method according to an aspect of the present invention is performed by a magnetic-field detection microcomputer including: a magnetic-field detection device which detects a magnetic field; a differential amplifier which amplifies an output voltage from the magnetic-field detection device; a variable voltage circuit which generates, according to a voltage control signal, a reference voltage that is variable; a comparator which compares an output from the differential amplifier with the reference voltage generated by the variable voltage circuit; a voltage controlling register which holds a voltage control value for controlling a level of the reference voltage generated by the variable voltage circuit, and outputs the voltage control signal having the voltage control value to the variable voltage circuit; and a storage unit configured to previously store a first table in which a magnetic-field intensity indicating an intensity of the magnetic field to be applied to the magnetic-field detection device and the voltage control value are associated with each other. The magnetic-field detecting method includes: setting, to the voltage controlling register, the voltage control value corresponding to the magnetic field to be detected; determining whether or not an output from the comparator is inverted; and reading out the magnetic-field intensity associated with the voltage control value from the first table, when in the determining, the output from the comparator is determined to be inverted.

With this method, a function and an effect which are equivalent to those obtained by the aforementioned magnetic-field detection microcomputer can be obtained.

Advantageous Effects

A magnetic-field detection microcomputer according to an aspect of the present invention does not require a complicated variable voltage circuit, and can easily determine presence or absence of a magnetic-field intensity.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 2A is a magnetic-field detection determination table.

FIG. 2B is a magnetic-field detection determination table for detecting a magnetic field having a reverse polarity.

FIG. 4C is a flowchart which shows a processing flow in determining a magnetic-field X.

DESCRIPTION OF EMBODIMENTS

Embodiment 1

Hereinafter, a most preferable embodiment for conducting the present invention is described, with reference to drawings.

First Embodiment

Figure 1:
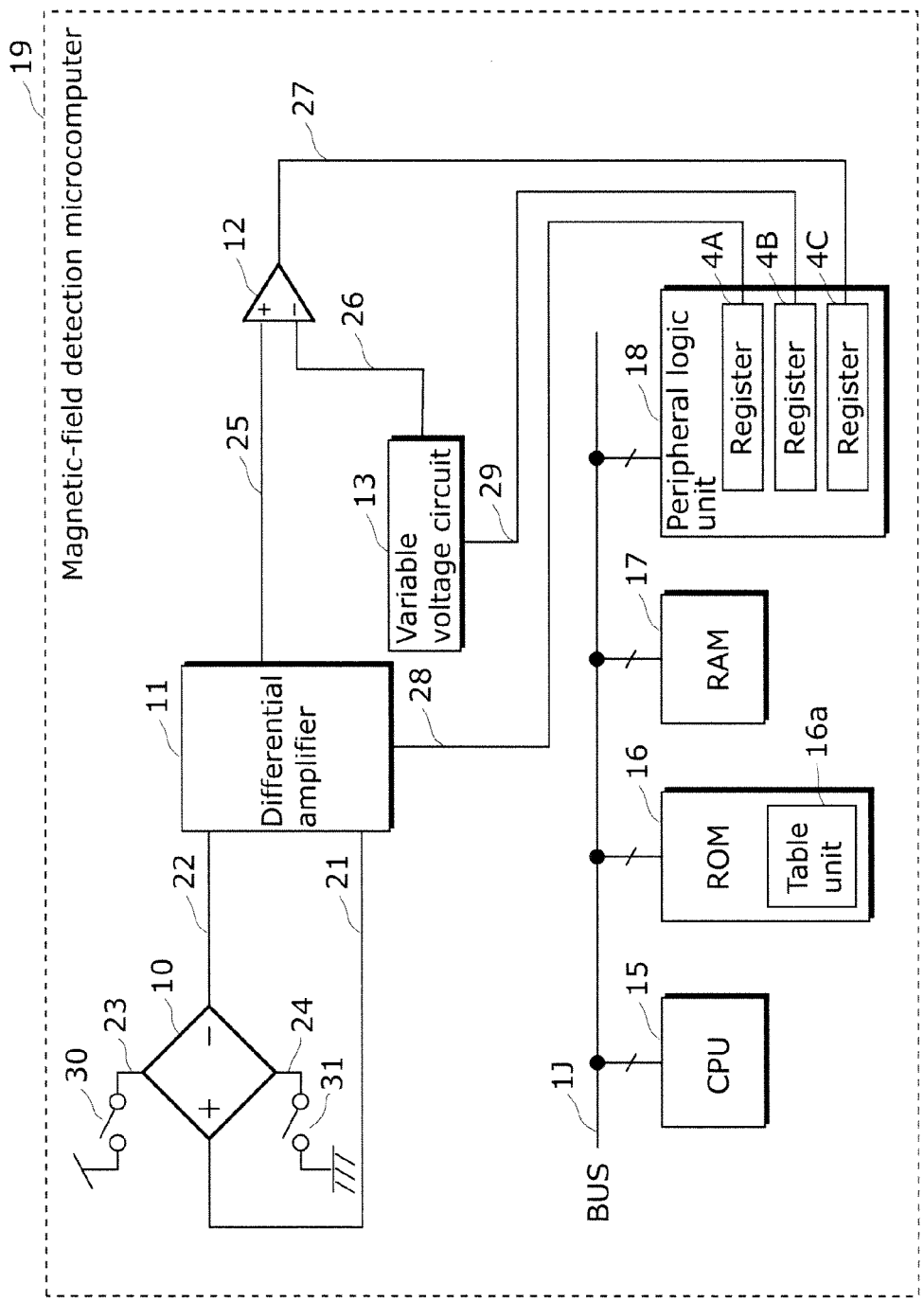
FIG. 1 is a block diagram which shows a magnetic-field detection microcomputer according to a first embodiment of the present invention.
Figures 2C, 3:
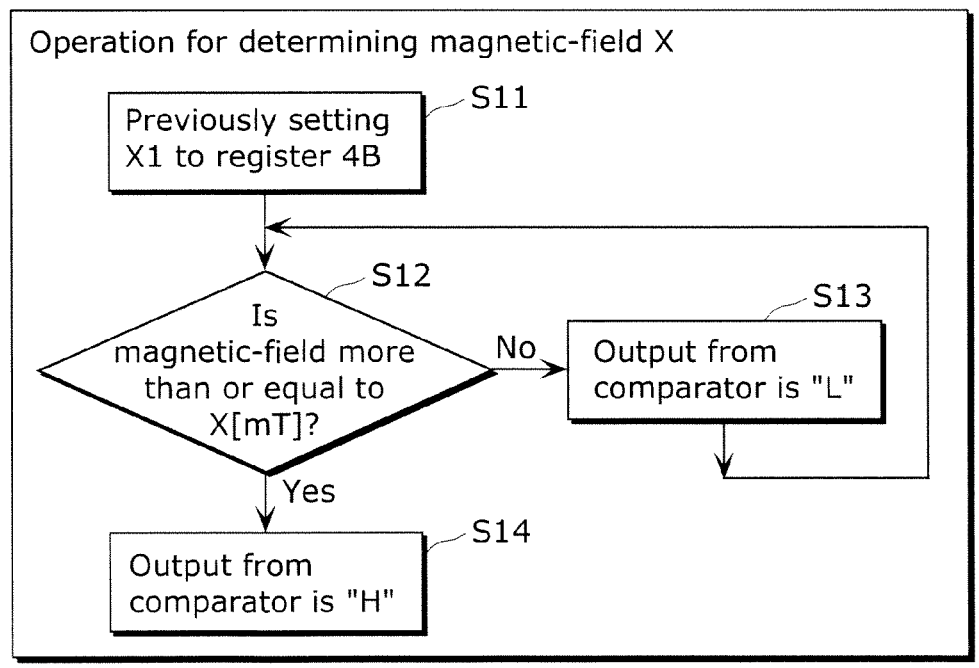
FIG. 2C is a magnetic-field detection determination table which includes a gain control value.
FIG. 3 is an operation-timing chart in relation to magnetic-field detection.

FIG. 1 is a block diagram which shows a magnetic-field detection microcomputer 19 according to a first embodiment of the present invention. The magnetic-field detection microcomputer 19 will be described referring to a magnetic-field detection determination table shown in FIG. 2A, an operation timing chart shown in FIG. 3 in relation to magnetic-field detection, magnetic-field detection setting algorithms shown in respective FIGS. 4A to 4E, and an operation timing chart shown in FIG. 5 in relation to execution of the magnetic-field detection setting algorithm. In the following description, the magnetic-field detection determination table shown in FIG. 2A is also referred to simply as a table in FIG. 2A.

As shown in FIG. 1, the magnetic-field detection microcomputer 19 includes a magnetic-field detection device 10 having four terminals, a differential amplifier 11 amplifying an output voltage from the magnetic-field detection device 10, a comparator 12 comparing an output from the differential amplifier 11 and a reference voltage generated by a variable voltage circuit 13, a CPU 15, a read-only memory (ROM) 16, a random access memory (RAM) 17, and a peripheral logic unit 18.

The magnetic-field detection device 10 is used for detecting a magnetic field.

The magnetic-field detection device 10 includes a first terminal 23 connected to a high-potential voltage VDD via a switch 30. A second terminal 24 is connected to a low-potential voltage VSS via a switch 31, while a third terminal 21 and a fourth terminal 22 are connected to inputs of the differential amplifier 11. The switches 30 and 31 are controlled by the CPU 15 so as to be turned ON when a magnetic field is detected and a table unit 16a is set up.

In the following description, if a configuration is described in which a structural component A is connected to a signal line used for transmitting a signal including a control signal, output, and the like, such a configuration is expressed as follows: the structural component A is connected to the signal (control signal, output, and the like). For example, if a configuration is described in which the structural component A is connected to the signal line used for transmitting the control signal, such a configuration is expressed as follows: the structural component A is connected to the control signal. In addition, if a configuration is described in which the structural component A is connected to the signal line used for transmitting an output from a certain circuit, for example, such a configuration is expressed as follows: the structural component A is connected to the output.

The differential amplifier 11 is capable of varying a gain, i.e. capable of switching an amplification degree of an output 25 (output voltage), according to a control signal 28 serving as a gain-control signal. In other words, the differential amplifier 11 can vary a gain, according to the gain control signal. The control signal 28 is connected to the peripheral logic unit 18 (a register 4A).

The output 25 from the differential amplifier 11 is connected to a positive input of the comparator 12. An output 26 from the variable voltage circuit 13 is connected, as a reference voltage, to a negative input of the comparator 12. In other words, the output 26 from the variable voltage circuit 13 is the reference voltage generated by the variable voltage circuit 13. Accordingly, the output 26 is an analog output.

The variable voltage circuit 13 is connected to a control signal 29 serving as a voltage control signal. The variable voltage circuit 13 generates a variable reference voltage (voltage of the output 26). The control signal 29 serving as the voltage control signal has a voltage control value for controlling a level of the reference voltage generated by the variable voltage circuit 13. Thus, the control signal 29 serving as the voltage control signal is a signal for varying a level of the reference voltage generated by the variable voltage circuit 13. Accordingly, the variable voltage circuit 13 generates the variable reference voltage (voltage of the output 26) according to the control signal 29 serving as the voltage control signal.

The comparator 12 compares the output 25 from the differential amplifier 11 and the reference voltage generated by the variable voltage circuit 13. Then, the comparator 12 outputs, as an output 27, the result of the comparison. The output 27 is a signal which indicates a level H (1) or a level L (0).

The peripheral logic unit 18 is connected to the control signal 29. The output 27 from the comparator 12 is connected to the peripheral logic unit 18. The CPU 15, ROM 16, RAM 17, and the peripheral logic unit 18 are connected to a mutually-shared BUS1J.

The register 4A holds a gain control value, and serves as a gain controlling register which outputs, to the differential amplifier 11, the gain control signal (the control signal 28) having the gain control value. The gain control value is a value for setting a gain of the differential amplifier 11.

The register 4B holds a voltage control value for controlling the level of the reference voltage generated by the variable voltage circuit 13, and serves as a voltage controlling register which outputs, to the variable voltage circuit 13, the voltage control signal (the control signal 29) having the voltage control value. The variable voltage circuit 13 generates the variable reference voltage (voltage of the output 26) according to the voltage control value belonged to the voltage control signal (the control signal 29). Accordingly, the variable voltage circuit 13 generates the variable reference voltage (voltage of the output 26) according to the control signal 29 serving as the voltage control signal.

The ROM 16 includes the table unit 16a. The table unit 16a includes tables shown in respective FIGS. 2A to 2C. The magnetic-field detection determination table shown in FIG. 2A is a first table described below. To be specific, the ROM 16 serving as a storage unit previously stores the first table (the magnetic-field detection determination table shown in FIG. 2A) in which a magnetic-field intensity that is an intensity of a magnetic field against the magnetic-field detection device 10 and the voltage control value immediately before or after an output from the comparator is inverted when the voltage control value is increased or decreased, are associated with each other. The magnetic-field intensity against the magnetic-field detection device 10 means the intensity of the magnetic field to be applied to the magnetic detection device 10.

Thus, the magnetic-field detection device 10 is a sensor (device) for detecting (finding) the intensity of the magnetic field to be applied to the magnetic-field detection device 10.

Here, an X-axis, a Y-axis, and a Z-axis perpendicular to one another are defined as follows. In the specification, one direction and the other direction both of which are along with the X-axis are respectively referred to as an X direction and a −X direction. In addition, one direction and the other direction both of which are along with the Y-axis are respectively referred to as a Y direction and a −Y direction. Furthermore, one direction and the other direction both of which are along with the Z-axis are respectively referred to as a Z direction and a −Z direction.

In the following description, a magnetic field in the X direction is also referred to as a magnetic-field X or an X magnetic-field. Furthermore, a magnetic field in the −X direction is also referred to as a magnetic-field −X or a −X magnetic-field. A magnetic field in the Y direction is also referred to as a magnetic-field Y or a Y magnetic-field. A magnetic field in the −Y direction is also referred to as a magnetic-field −Y or a −Y magnetic-field. A magnetic field in the Z direction is also referred to as a magnetic-field Z or a Z magnetic-field. A magnetic field in the −Z direction is also referred to as a magnetic-field −Z or a −Z magnetic-field.

Figure 4A:
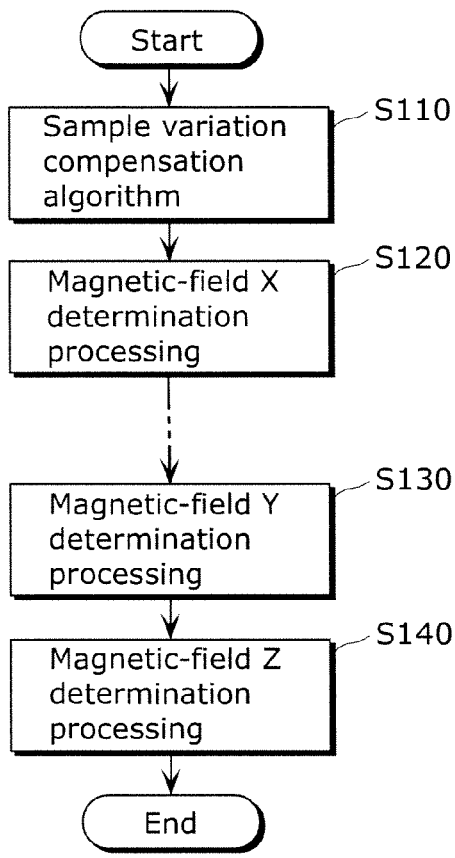
FIG. 4A is a flowchart which shows a whole processing flow of a magnetic-field detection setting algorithm.

When the first table is created, the CPU 15 increases or decreases a value held by the voltage controlling register (the register 4B) under a condition that a known magnetic field (any one of magnetic-free field, the magnetic-field X, the magnetic-field Y, the magnetic-field Z or the like) is applied to the magnetic-field detection device 10, as shown in FIG. 4A. When the output from the comparator 12 is inverted, the CPU 15 writes, in the first table, a value of the register 4B immediately before or after the inverting, as a voltage control value for the known magnetic field.

When the magnetic field is detected (when presence or absence of the magnetic-field X is detected, for example), the CPU 15 sets the voltage control value for the magnetic field to be detected, in the voltage controlling register (the register 4B). The CPU 15 determines whether or not the output from the comparator 12 is inverted. When the CPU 15 determines that the output from the comparator 12 is inverted, the CPU 15 reads out, from the first table, the magnetic-field intensity associated with the voltage control value set in the voltage controlling register (the register 4B). Accordingly, the CPU 15 determines whether or not the magnetic-field intensity associated with the voltage control value exists.

To be specific, the CPU 15 determines whether or not the magnetic-field intensity associated with the voltage control value exists based on a result of the comparison by the comparator 12 and the first table.

For example, the CPU 15 may subsequently increase or decrease the voltage control value held in the voltage controlling register (the register 4B) when the magnetic field is detected, and may read out, from the first table, the magnetic-field intensity associated with the voltage control value, as the detected magnetic-field intensity.

Here, the control signal 28 for switching the amplification degree of the differential amplifier 11, the control signal 29 for switching the reference voltage of the variable voltage circuit 13, and the output 27 from the comparator 12 are respectively connected to the register 4A, the register 4B, and a register 4C in the peripheral logic unit 18 block. Accordingly, the respective values of the register 4A, register 4B, and the register 4C can be arbitrarily rewritten by a program in a microcomputer. The microcomputer means a magnetic-field detection microcomputer (for example, the magnetic-field detection microcomputer 19) to be described in each of the embodiments.

In the register 4C, the output 27 (0 or 1) from the comparator 12 is written every time the comparator 12 outputs the output 27 which indicates a different value. The number "0" is a value which corresponds to the level L. The number "1" is a value which corresponds to the level H.

In the following description, the level L and the level H may be respectively expressed simply by L and H.

The CPU 15 always refers to the value of the register 4C, and determines whether or not the output (the value of the register 4C) from the comparator 12 is inverted. The fact that the output from the comparator 12 is inverted means that the value of the register 4C varies. The value of the register 4C varies, for example, from 0 (L) to 1 (H).

When the CPU 15 determines that the output 27 from the comparator 12 is inverted, the CPU 15 reads out, from the first table in the ROM 16, the magnetic-field intensity associated with the voltage control value set in the voltage controlling register (the register 4B). In this case, the CPU 15 determines that the magnetic-field intensity associated with the voltage control value exists. On the other hand, if the CPU 15 does not determine that the output 27 from the comparator 12 is inverted, the CPU 15 also determines that the magnetic-field intensity does not exist which corresponds to the voltage control value. As aforementioned, the CPU 15 determines whether or not the magnetic-field intensity associated with the voltage control value exists.

In such a block configuration, the magnetic-field detection device 10 first generates, between the terminals 21 and 22, a voltage in proportion to amplitude of the magnetic field to be applied to a plane surface of the magnetic-field detection device 10 in the vertical direction. The differential amplifier 11 amplifies, with an arbitral amplification factor, voltage difference between the terminals 21 and 22, and outputs an analog voltage to the output 25. The output 25 is, thus, the analog output.

The amplification factor in the differential amplifier 11 can be doubled or quadrupled by writing an arbitral digital value in the register 4A using the program in the microcomputer.

The comparator 12 compares the output 25 from the differential amplifier 11 with the output 26 from the variable voltage circuit 13. If the output 25 is larger than the output 26, the output 27 from the comparator 12 indicates the level H (1), whereas if the output 25 is smaller than the output 26, the output 27 from the comparator 12 indicates the level L (0).

FIG. 2A is a magnetic-field detection determination table.

In FIG. 2A, the magnetic-field intensity X[mT] is an intensity of the magnetic field in the X-direction. The magnetic-field intensity Y[mT] is an intensity of the magnetic field in the Y-direction. The magnetic-field intensity Z[mT] is an intensity of the magnetic field in the Z-direction.

In the following description, the magnetic field having the magnetic-field intensity X[mT] may be referred to as a magnetic field X[mT] or simply as X[mT]. The magnetic field having the magnetic-field intensity Y[mT] may be referred to as a magnetic field Y[mT] or simply as Y[mT]. The magnetic field having the magnetic-field intensity Z[mT] may be referred to as a magnetic field Z[mT] or simply as Z[mT].

In addition, in the following description, the magnetic field having the magnetic-field intensity X[mT] in the −X-direction may be referred to as a magnetic field −X[mT] or simply as −X[mT]. The magnetic field having the magnetic-field intensity Y[mT] in the −Y-direction may be referred to as a magnetic field −Y[mT] or simply as −Y[mT]. The magnetic field having the magnetic-field intensity Z[mT] in the −Z direction may be referred to as a magnetic field −Z[mT] or simply as −Z[mT].

The magnetic-field detection determination table shown in FIG. 2A is a table for detecting the magnetic-field intensity X[mT] by setting a digital code X1 in the register 4B. The magnetic-field detection determination table shown in FIG. 2A can also include a plurality of magnetic-field intensities including Y[mT] and Z[mT].

FIG. 2B is a magnetic-field detection determination table for detecting a magnetic field having a reverse polarity to the magnetic field shown in FIG. 2A. In the following description, the magnetic-field detection determination table shown in FIG. 2B is also simply referred to as a table in FIG. 2B.

In FIG. 2B, −X[mT] means an intensity of the magnetic field in the −X-direction. −Y[mT] means an intensity of the magnetic field in the −Y-direction. −Z[mT] means an intensity of the magnetic field in the −Z-direction.

FIG. 2C is a magnetic-field detection determination table also indicating a gain control value for setting the amplification factor (gain) of the differential amplifier 11. The gain control value is, for example, indicated as G1.

Here, a magnetic field applied to the magnetic-field detection device 10 at the time when the north pole of a magnet approaches to the planer surface of the magnetic-field detection device 10 in the vertical direction is defined as a positive magnetic-field. Meanwhile, a magnetic field applied to the magnetic-field detection device 10 at the time when the south pole of a magnet approaches to the planer surface of the magnetic-field detection device 10 is defined as a negative magnetic-field.

In such a block configuration, at least one of the magnetic-field detection determination tables shown in respective FIGS. 2A to 2C is previously written in the ROM 16. When the magnetic-field detection microcomputer is operated, thereby performing the operation indicated in the operation timing chart of the magnetic-field detection as shown in FIG. 3. The processing shown in FIG. 3 is performed by the CPU 15.

As shown in FIG. 3, the CPU 15 previously sets the digital code X1 in the register 4B for the magnetic field (the magnetic field X[mT], for example) to be detected (Step S11). If the intensity of the magnetic field to be applied to the magnetic-field detection device 10 is smaller than X[mT] (No in Step S12), the output 27 from the comparator 12 becomes L (Step S13). On the other hand, if the intensity of the magnetic field applied to the magnetic-field detection device 10 is more than or equal to X[mT] (Yes in Step S12), the output 27 from the comparator 12 indicates H (Step S14). In this case, 1 is written in the register 4C. The CPU 15 performs the magnetic-field detection in accordance with a result whether or not the value of the register 4C varies, i.e., whether or not the output 27 from the comparator 12 is inverted.

Figure 5:
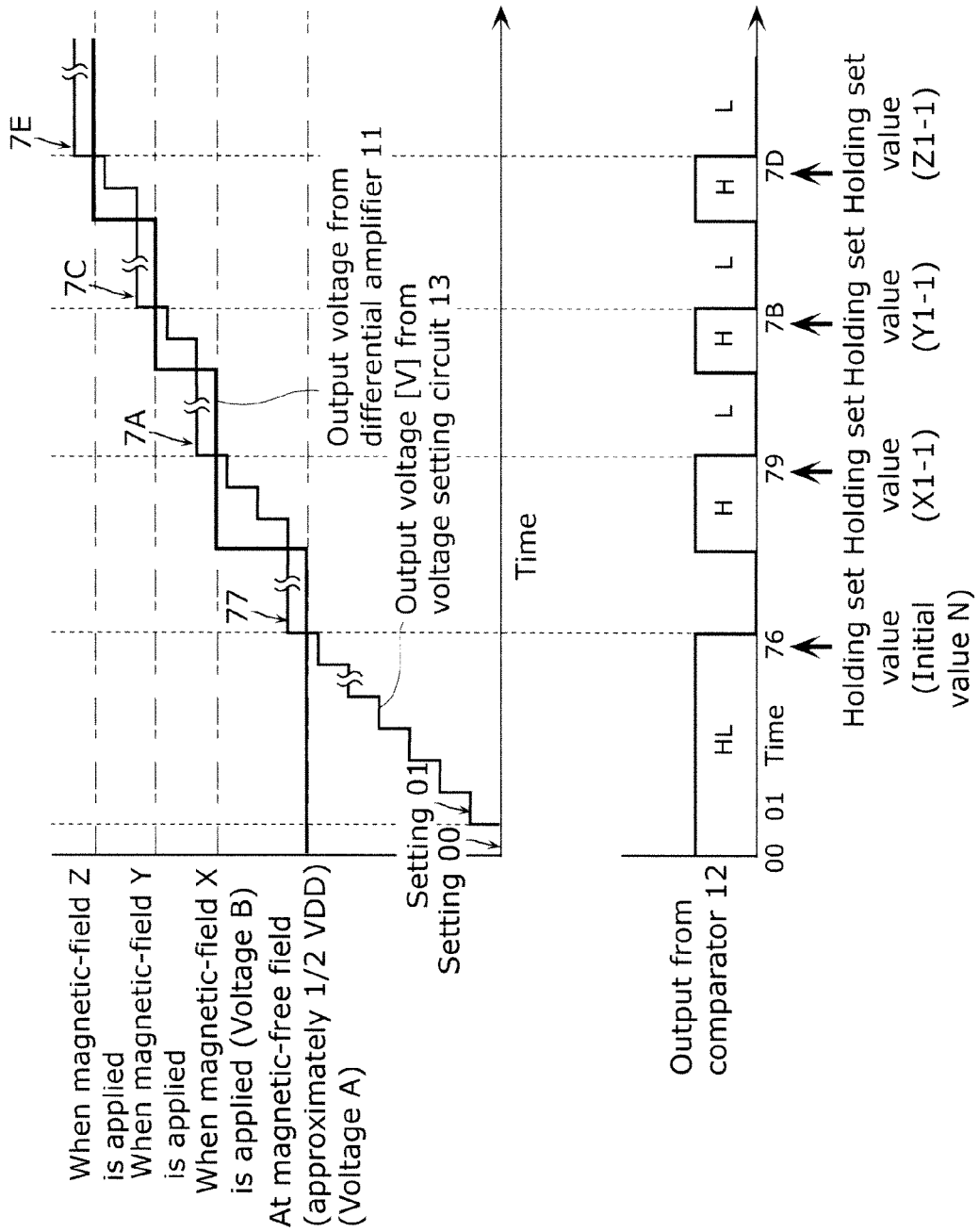
FIG. 5 is an operation-timing chart when the magnetic-field detection setting algorithm is executed.

The magnetic-field detection setting algorithm for determining the magnetic-field application determination table shown in FIG. 2A and the operation upon the execution are described, respectively referring to the magnetic-field detection setting algorithm shown in FIG. 4A and the operation timing chart shown in FIG. 5.

Figure 4B:
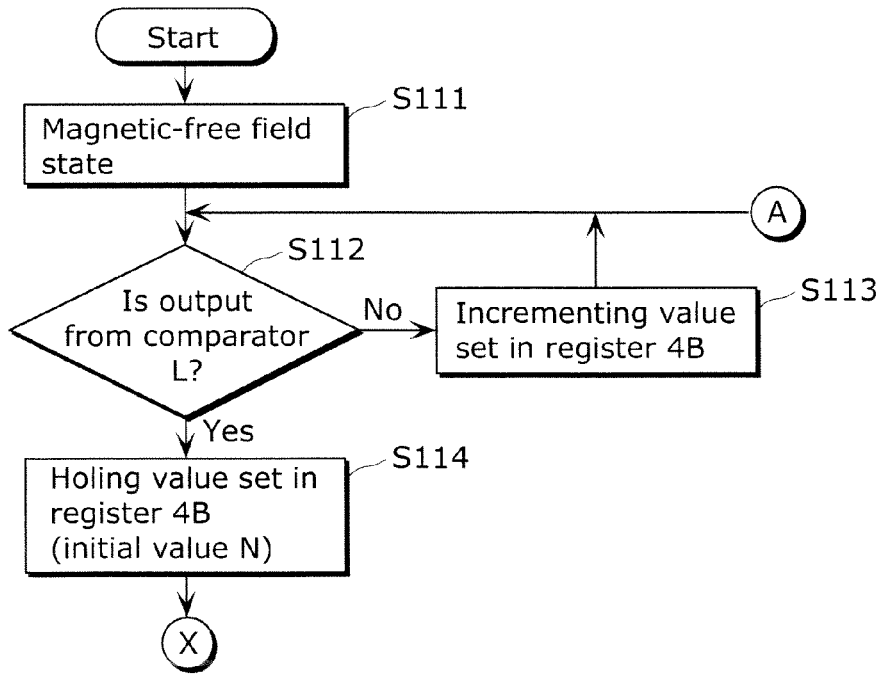
FIG. 4B is a flowchart which shows a processing flow of sample variation compensation algorithm in the magnetic-field detection setting algorithm.

FIG. 4B is a processing flowchart which shows a processing flow of a sample variation compensation algorithm in the magnetic-field detection setting algorithm shown in FIG. 4A. In the specification, the sample means the magnetic-field detection device 10 serving as a sensor.

Figure 4D:
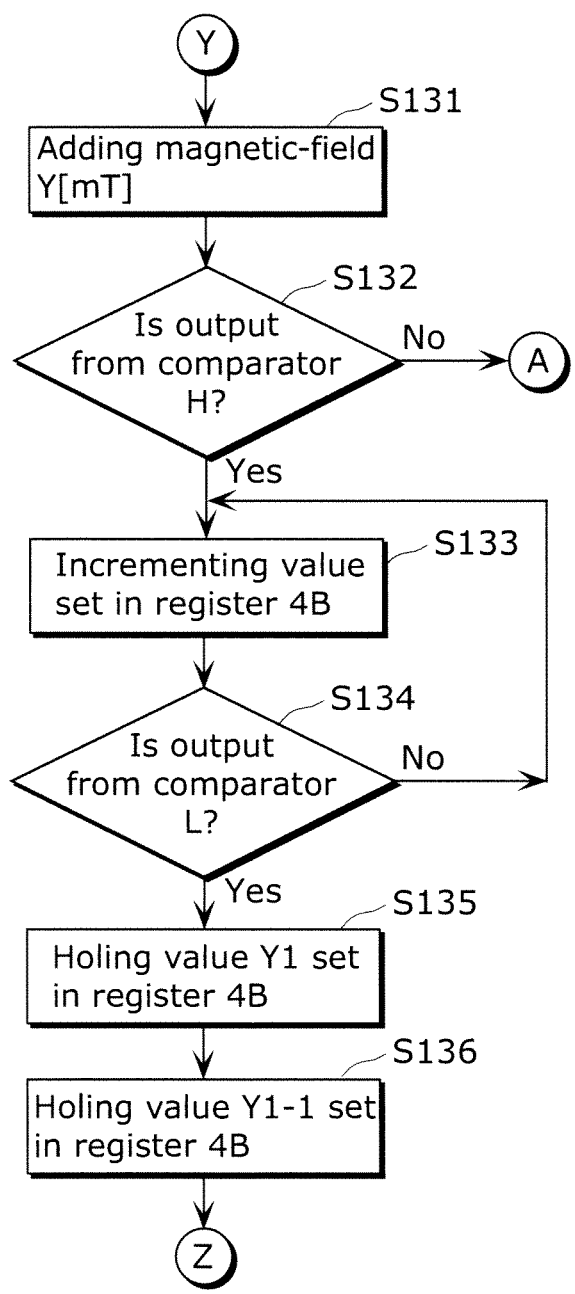
FIG. 4D is a flowchart which shows a processing flow in determining a magnetic-field Y.
Figure 4E:
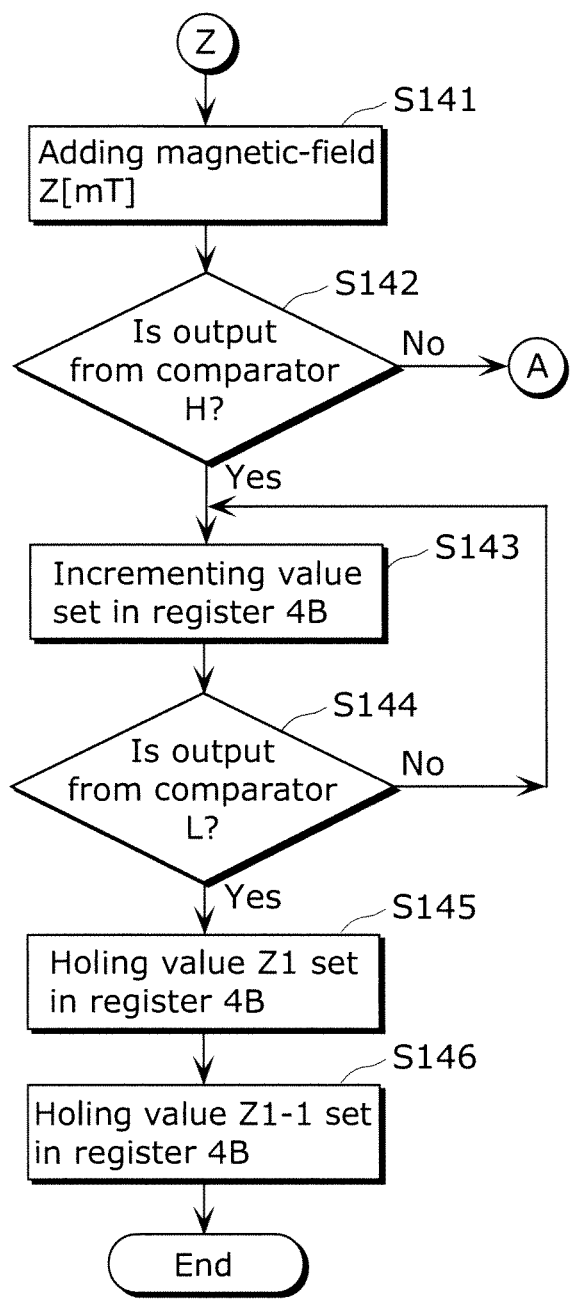
FIG. 4E is a flowchart which shows a processing flow in determining a magnetic-field Z.

FIG. 4C is a flowchart which shows a processing flow of a magnetic-field X determination processing in the magnetic-field detection setting algorithm shown in FIG. 4A. FIG. 4D is a flowchart which shows a processing flow of a magnetic-field Y determination processing in the magnetic-field detection setting algorithm shown in FIG. 4A. FIG. 4E is a flowchart which shows a processing flow of a magnetic-field Z determination processing in the magnetic-field detection setting algorithm shown in FIG. 4A.

First, an arbitrary digital value can be set in the register 4B by the program in the microcomputer. The variable voltage circuit 13 is configured so that the output 26 from the variable voltage circuit 13 increases in proportion to magnitude of the set digital value.

Figure 11:
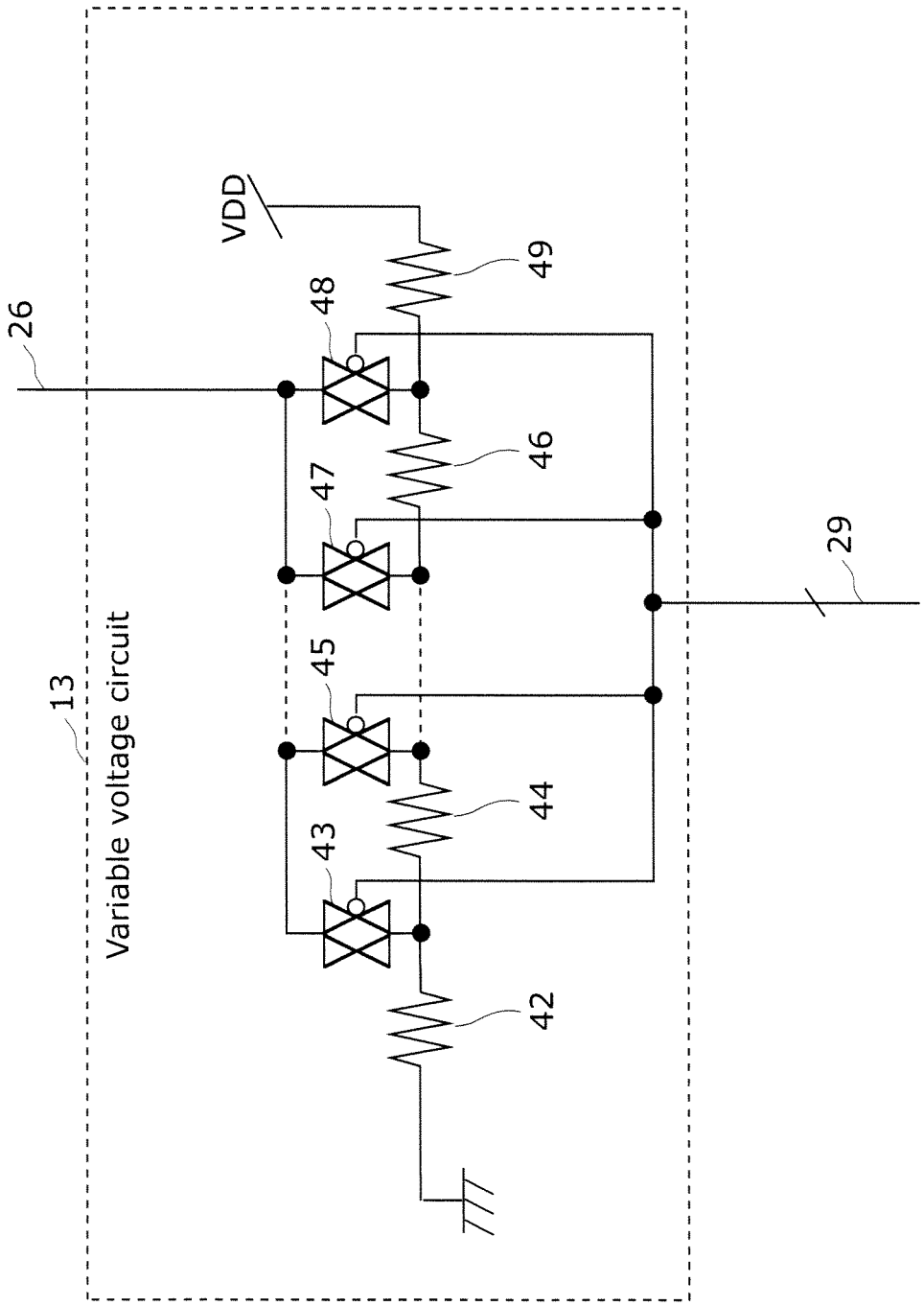
FIG. 11 is a diagram which shows an inside circuit of a variable voltage circuit.

FIG. 11 shows a circuit inside a block of the variable voltage circuit 13. The variable voltage circuit 13 includes reference resistors 42, 44, 46, and 49, and analog switches 43, 45, 47, and 48. The reference resistor 42 includes one terminal connected to a ground (GND) and the other terminal is connected to the reference resistor 44 and the analog switch 43. Likewise, the reference resistors 44, 46, and 49 are respectively connected, in an array, to the analog switches 45, 47, and 48. A terminal of the reference resistor 49 is connected to the VDD.

Respective gates of the analog switches 43, 45, 47, and 48 are connected to the control signal 29 which is shown in FIG. 1. The digital value of the control signal 29 causes one of the analog switches 43, 45, 47, and 48 to be selected, thereby defining an arbitrary reference resistance which causes a voltage obtained by dividing the voltage between the VDD and the VSS to be outputted as the output 26.

Figure 12:
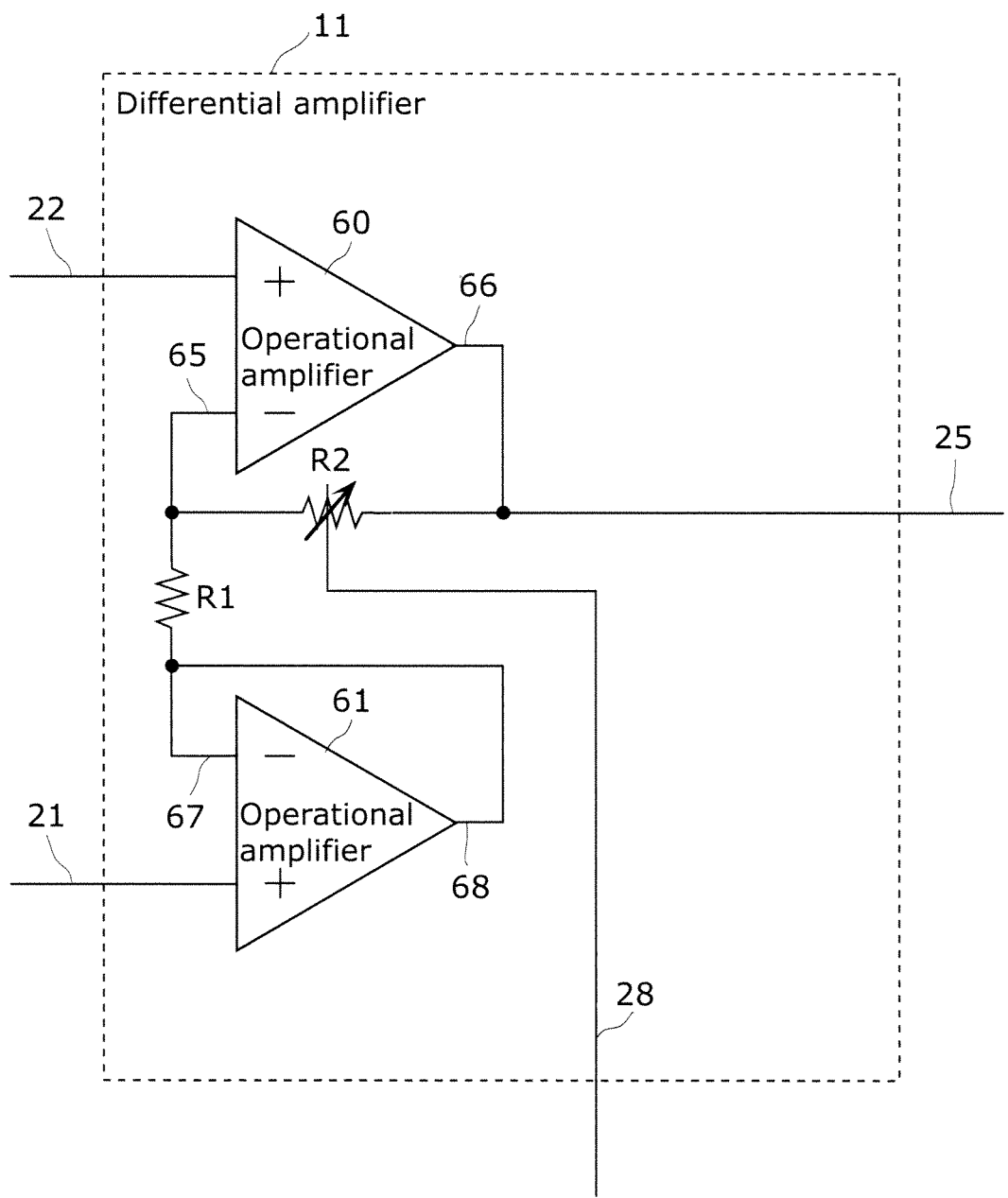
FIG. 12 is a diagram which shows an inside circuit of a differential amplifier.

Next, the operation of the differential amplifier 11 is described. FIG. 12 is a diagram which shows an inside of the circuit of the differential amplifier 11. The differential amplifier 11 includes two operational amplifiers 60 and 61, and reference resistors R1 and R2. The reference resistor R2 includes a variable resistor, and a resistance value of the reference resistor R2 can be varied by the control signal 28.

A positive input of the operational amplifier 60 is connected to the terminal 22 which is one of the terminals of the magnetic-field detection device 10. A positive input of the operational amplifier 61 is connected to the terminal 21 which is one of the terminals of the magnetic-field detection device 10. A negative input 67 of the operational amplifier 61 and an output 68 of the operational amplifier 61 are short circuited. The output 68 is connected to one terminal of a reference resistor R1.

The other terminal of the reference resistor R1 is connected to a negative input 65 and one terminal of a reference resistor R2. The other terminal of the reference resistor R2 is connected to an output 66 from the operational amplifier 60 and the output 25.

Although the reference resistor R2 is a variable resistor, the reference resistor R1 may be the variable resistor instead of the reference resistor R2.

Here, in the terminal 21, a plus voltage Vp of the magnetic-field detection device 10 is generated, while a minus voltage Vn of the magnetic-field detection device 10 is generated in the terminal 22. In the magnetic-field detection device 10, Vp=Vn=approximately VDD/2 is satisfied in a magnetic-free field state in which no magnetic field is generated. Thus, the voltage difference between the Vp and the Vn ideally becomes 0V. A magnetic field is applied to the magnetic-field detection device 10, causing a voltage to be generated between the Vp and the Vn. Accordingly, an electric potential expressed by VDD/2+(Vp−Vn)×(R2/R1+1) is generated in the output 25.

As shown in FIG. 1, the output 25 from the differential amplifier 11 is connected to the positive input of the comparator 12, while the output 26 from the variable voltage circuit 13 is connected to the negative input of the comparator 12. If the output 25 is larger than the output 26, the output 27 indicates H(1). If the output 26 is larger than the output 25, the output 27 indicates L(0).

The sample variation compensation algorithm (Step S110) in FIG. 4A is described. The voltage difference between the Vp and the Vn in the magnetic-free field state is assumed to be illimitably dose to 0V for easy comprehension. In this case, since the second term of the output 25 is 0 in the expression of VDD/2+(Vp−Vn)×(R2/R1+1) in the magnetic-free field state, the output 25 becomes approximately VDD/2.

FIG. 5 shows the approximate VDD/2 as a voltage A. The output 26 from the variable voltage circuit 13 is an arbitrary voltage value based on resistor division inside the variable circuit 13 due to a digital value set to the register 4B.

When the value of the resistor 4B is 00, the output 26 from the variable voltage circuit 13 indicates the VSS. When the value of the register 4B is FF, the output 26 indicates the VDD. As shown in FIGS. 4B and 5, the CPU 15 writes 00 in the register 4B so as to perform default setting so that the output 26 from the variable voltage circuit 13 becomes VSS.

At this time, the output 25 indicates VDD/2 in the magnetic-free field state (Step S111). Accordingly, the output 27 from the comparator 12 becomes H. The CPU 15 increments a digital setting value in the register 4B of the variable voltage circuit 13 (Step S113) until the output 27 from the comparator 12 becomes L (Yes in the step S112), so that comparison operation is operated.

If the output 26 from the variable voltage circuit 13 becomes a value larger than the output 25, the output 27 from the comparator 12 becomes L. The CPU 15 holds, in the ROM 16, the value in the register 4B of the variable voltage circuit 13 for this occasion as an initial value N. This value is attributed to process variation, and thus, varies in each of samples. Therefore, the value is written in the ROM 16, and read out therefrom when needed, so that subsequent sample variation compensation can be addressed.

Next, a magnetic-field X determination processing (Step S120) as the magnetic-field X detection determination algorithm shown in FIG. 4C is described.

Under the condition in which the CPU 15 set the initial value N, the output 27 from the comparator 12 indicates L. However, if the magnetic field X[mT] is applied to the magnetic-field detection device 10 (Step S121), the voltage difference between the Vp and the Vn increases correspondingly to the magnet-field X[mT]. As a result, the output 25 is amplified by an amount expressed by (Vp−Vn)×(R2/R1+1). The amplified voltage is added to an output voltage (the voltage A (VDD/2)) of the differential amplifier 11 at the initial value N, and becomes a voltage B (see FIG. 5).

At this time, since the voltage B is larger than the output 26 from the variable voltage circuit 13, the output 27 from the comparator 12 becomes H. The CPU 15 increments the digital setting value of the register 4B in the variable voltage circuit 13 (Step S123) until the output 27 from the comparator 12 becomes L (Yes in Step S124) similarly to the step S112 and step S113, so that the comparison operation is repeated.

If the output 26 from the variable voltage circuit 13 becomes a value larger than the output 25, the output 27 from the comparator 12 becomes L. FIG. 5 shows that the value of the register 4B is 7A (Step S125). A digital value obtained by subtracting 1 or more from the value (7A) of the register 4B of the variable voltage circuit 13 (i.e., a value immediately before the value (7A)) is held in the ROM 16 as X1-1 (Step S126).

In the magnetic-field Y determination processing (Step S130) as the magnetic-field Y detection determination algorithm shown in FIG. 4D, processing same as the magnetic-field X determination processing (Step S120) is performed. To be specific, the magnetic-field Y[mT] is applied to the magnetic-field detection device 10 (Step S131), the digital setting value in the register 4B of the variable voltage circuit 13 is incremented (Step S134), and the comparison operation (Step S134) is repeated.

If the output 26 from the variable voltage circuit 13 becomes a value larger than the output 25, the output 27 from the comparator 12 becomes L (Yes in Step S134). FIG. 5 shows that the value of the register 4B is 7C (Step S135). The CPU 15 holds a digital value obtained by subtracting 1 or more from a value (7C) in the register 4B of the variable voltage circuit 13, as Y1-1, in the ROM 16 (Step S135).

In the magnetic-field Z determination processing (Step S140) as the magnetic-field Z detection determination algorithm, processing same as the magnetic-field X determination processing or the magnetic-field Y determination processing is performed. Thus, the magnetic-field Z[mT] is applied to the magnetic-field detection device 10 (Step S141). The processing in Steps S142 to S145 is performed. Accordingly, Z1-1 is held in the ROM 16 (Step S146).

Values of X1-1, Y1-1, and Z1-1 written in the ROM 16 are written in the register 4B by the program of the microcomputer when it is determined whether or not the application of the magnetic-field is detected, so that the output 26 from the variable voltage circuit 13 is set to an arbitrary voltage for detecting detect the magnetic field.

Based on the algorithm, the magnetic-field application determination table shown in FIG. 2A is written in the ROM 16. Therefore, when the magnetic field X is to be detected, for example, and the intensity of the magnetic field to be applied to the magnetic-field detection device 10 is more than or equal to X[mT] (Yes in Step S12), the output 27 from the comparator 12 becomes H (Step S14), as operation shown in FIG. 3. Therefore, the CPU 15 can determine whether or not the magnetic field exists.

As described above, the block configuration shown in FIG. 1 and the execution of the respective magnetic-field detection setting algorithms shown in FIG. 4A to FIG. 4E allow the setting values of the magnetic-field detection to be surely written in the ROM 16 for each of the samples. This reduces the sample variation, and allows the CPU 15 to detect a plurality of magnetic-field intensities of X[mT], Y[mT], Z[mT].

The respective magnetic-field detection setting algorithms shown in FIGS. 4A to 4E are executed for a microcomputer (the magnetic-field detection microcomputer 19) implemented on a set, thereby reducing an error in the magnetic-field detection level for each of the samples, certainly performing the magnetic-field detection, and detecting a plurality of magnetic-field intensity levels. The magnetic-field detection setting algorithms shown in FIGS. 4A to 4E are executed at delivery inspection of microcomputers shipped as magnetic-field detection microcomputers, so that the algorithms can be operated at shipment of the microcomputer. In other words, the processing shown in FIGS. 4A to 4E are executed as the magnetic-field detection setting algorithms at the delivery inspection of microcomputers for implementing the magnetic-field input determination tables. It is beneficial for setting the microcomputer (magnetic-field detection microcomputer), since the implementation of the magnetic-field input determination tables can be facilitated.

When the magnet-field detection setting algorithms shown in FIGS. 4A to 4E are executed upon the inspection of the microcomputer, the below-shown merits can further be obtained. The delivery inspection of a semiconductor chip often performed under a plurality of temperature conditions, including any of a low temperature, normal temperature, high temperature, and the like, for ensuring the operation of the semiconductor chip in a determined temperature range. A digital value to be set to the register 4B for the occasion, for detecting the magnetic field X[mT] is X1-1 which is 1 or more lower value than X1, as described above.

A method for determining the magnetic-field X[mT] more accurately is described. Typically, when the magnetic-field X[mT] is applied to the magnetic-field detection device 10, temperature-property dependency exists in the voltage difference (magnetic-field susceptibility) between the Vp and the Vn of the magnetic-field detection device 10.

On the other hand, when the reference resistors 42, 44, 46, and 49 shown in FIG. 11 are designed by a same resistor array, the variable voltage circuit 13 has a voltage division ratio which is approximately constant at all times irrespective of temperature. The temperature compensation need not be performed according to the temperature characteristics of the magnetic-field detection device 10. In the magnetic-field detection device 10, the magnetic-field susceptibility is assumed to be lower in the high temperature than that in the low temperature or the normal temperature.

In this case, even if the same magnetic-field X[mT] is applied to the magnetic-field detection device 10, the value expressed by VDD/2+(Vp−Vn)×(R2/R1+1) becomes lower at the high temperature than that in the low temperature or the normal temperature. For this reason, the output voltage (the voltage B) to be described with reference to FIG. 5 becomes lower. Thus, if X1-1 is set in the register 4B at the low temperature or the normal temperature, the output voltage B is lower than the output 26 from the variable voltage circuit 13 at the high temperature. This may preclude the magnetic-field X[mT] from being detected. It is necessary to set X1-1 taking the temperature characteristics into account.

In such a case, the respective magnetic-field detection setting algorithms shown in FIG. 4A to FIG. 4E are executed at the time of the delivery inspection of the microcomputer under the temperature condition (high temperature in the description) in which the output voltage B upon application of the magnetic-field is lowest. It is needless to say that the above surely enables the detection, while reducing temperature variation in addition to the sample variation.

As aforementioned, the respective magnetic detection setting algorithms shown in FIGS. 4A to 4E are executed in the temperature condition in which the magnetic-field susceptibility lowers, thereby achieving more accurate magnetic-field detection.

As described above, the magnetic-field detection microcomputer according to the first embodiment includes: the magnetic-field detection device 10 which detects the magnetic-field; the differential amplifier 11 which amplifies the output voltage from the magnetic-field detection device 10; the variable voltage circuit 13 which generates, according to the voltage control signal (control signal 29), the reference voltage that is variable; the comparator 12 which compares the output from the differential amplifier 11 with the reference voltage generated by the variable voltage circuit 13; the voltage controlling register (register 4B) which holds the voltage control value for controlling the level of the reference voltage generated by the variable voltage circuit 13 and outputs the voltage control signal (control signal 29) having the voltage control value to the variable voltage circuit 13; the storage unit (ROM 16) which previously stores the first table in which the magnetic-field intensity that indicates the intensity of the magnetic-field to be applied to the magnetic-field detection device 10 and the voltage control value immediately before or after the output from the comparator is inverted when the voltage control value increases or decreases, are associated with each other; and the CPU 15 which sets the voltage control value corresponding to the magnetic-field subjected to the detection in the voltage controlling register, and determines the presence or absence of the magnetic-field intensity associated with the voltage control value based on the result of the comparison by the comparator 12 and the first table.

With this configuration, simple processing makes it possible to determine whether or not the magnetic-field intensity associated with the voltage control value exists. In the simple processing, the voltage control value and the magnetic-field intensity are previously stored in the storage unit (ROM 16), and the voltage control value corresponding to the magnetic field to be detected is set in the voltage controlling register (register 4B). Therefore, the presence or absence of the magnetic-field intensity associated with the voltage control value can be easily determined.

The conventional voltage variation circuit has a configuration in which two types of reference voltages are generated. However, the variable voltage circuit 13 of the magnetic-field detection microcomputer 19 is configured to generate one reference voltage (the output 26). Accordingly, the configuration of the variable voltage circuit 13 can be simplified.

Therefore, the magnetic-field detection microcomputer 19 does not require a variable voltage circuit having a complicated configuration, and can easily determine whether or not the magnetic-field intensity exists. In other words, the magnetic-field detection microcomputer 19 can easily determine whether or not the magnetic-field intensity exists using the variable voltage circuit 13 having a simple configuration.

The voltage control value and the magnetic-field intensity are previously stored in the storage unit (ROM 16), thereby easily determining whether or not the magnetic-field intensity associated with the voltage control value exists. The magnetic-field detection microcomputer 19 does not require a complicated analog circuit, and can easily reduce variation in characteristics of the sensor (the magnetic-field detection device 10).

The gain of the differential amplifier 11 is variable according to the gain control signal. In other words, the gain (degree of the amplification) of the output from the differential amplifier 11 is switched according to the gain control value included in the gain control signal. The magnetic-field detection microcomputer 19 may further hold the gain control value, and include a gain control register (the register 4A) which outputs the gain control signal (the control signal 28) having the gain control value to the differential amplifier 11.

The first table is stored in the ROM 16, and previously stores the magnetic-field intensity and the voltage control value for each of the gain control values.

The CPU 15 sequentially increases or decreases the voltage control values held in the voltage controlling register (the register 4B) when the magnetic field is detected, and reads out the magnetic-field intensity associated with the voltage control value from the first table as the detected magnetic-field intensity, when the output from the comparator is inverted.

The CPU 15, upon setting the table, sequentially increases or decreases the held values in the voltage controlling register (the register 4B) in the condition where an existing magnetic-field (for example, any one of the magnetic-free field, the magnetic-fields X, Y, Z, and the like) is subjected to the processing in the magnetic-field detection device 10, and writes, when the output from the comparator is inverted, a value of the register 4B immediately before or after the inverting, in the first table (the table shown in FIG. 2A), as the voltage control value corresponding to the existing magnetic field. A table shown in FIG. 2B (a second table) and a table shown in FIG. 2C can be created in the same manner.

Although in the first embodiment, three examples including, as an arbitrary magnetic-field, the magnetic field X, magnetic field Y, magnetic field Z are used for the description, the number of the examples is not necessarily limited to three, and any number of examples may be used.

Second Embodiment

Figure 6:
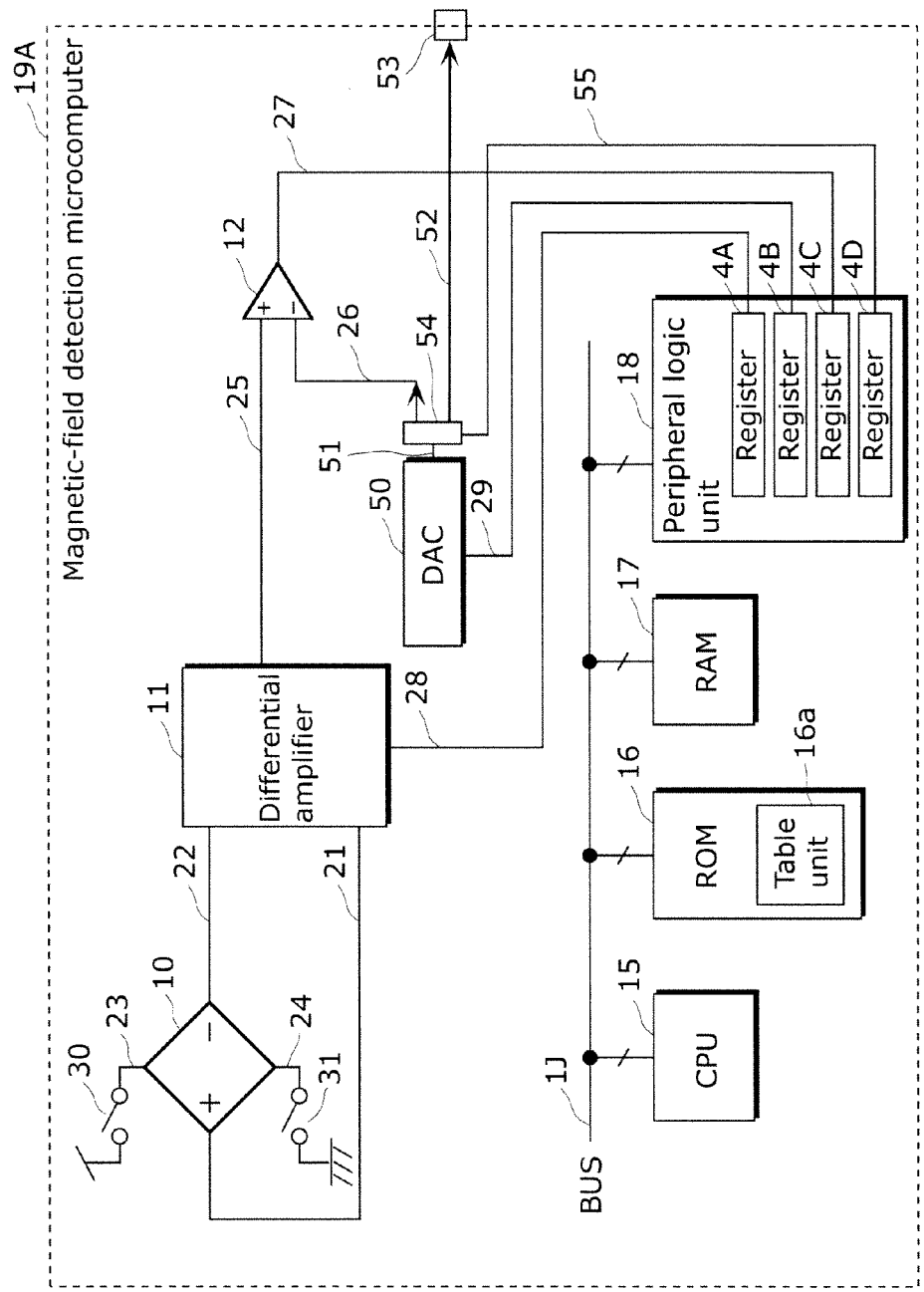
FIG. 6 is a block diagram which shows a magnetic-field detection microcomputer according to a second embodiment of the present invention.

FIG. 6 is a block diagram which shows a magnetic-field detection microcomputer 19A according to a second embodiment of the present invention.

Hereinafter, with respect to a configuration of the magnetic-field detection microcomputer 19A, a point different from the configuration of the magnetic-field detection microcomputer 19 shown in FIG. 1 is mainly described.

As shown in FIG. 6, the magnetic-field detection microcomputer 19A includes a digital analog converter (DAC) 50 instead of the variable voltage circuit 13 which is included in the magnetic-field detection microcomputer 19 shown in FIG. 1. The DAC 50 works as a digital-to-analog (D/A) converter. Accordingly, the variable voltage circuit 13 may be the D/A converter (DAC 50). The DAC 50 generates an output 51 as the reference voltage.

The output 51 from the DAC 50 is connected to an input of the analog output selection circuit 54. The analog output selection circuit 54 is connected to a control signal 55 for selecting one of the outputs 26 and 52. The control signal 55 is connected to the register 4D.

The output 52 is connected, as a DAC output terminal, to a pad 53 which is on a semiconductor chip of the microcomputer, and for outputting a signal. With this configuration, if the DAC 50 is desired to be used versatility, an arbitrary value of the register 4D is set by the program of the microcomputer, and the output 51 from the DAC 50 can be outputted to the DAC output terminal (the pad 53).

If the magnetic-field detection is desired to be performed, the output 51 from the DAC 50 may be outputted as the output 26. Thus, the analog output according to an arbitrary digital code can be output to a terminal by the program of the microcomputer, so that the DAC functions.

Meanwhile, if the output 26 is selected by the control signal 55, the magnetic field can be detected. As a versatile object, some microcomputers originally include the DAC therein. If the second embodiment is applied to the microcomputer including the DAC, the need for the variable voltage circuit 13 is eliminated. Accordingly, a chip area can be reduced.

The DAC 50 included in the microcomputer (the magnetic-field detection microcomputer 19A) often has 8-bit or more resolution. If the DAC 50 is a DAC having the 8-bit resolution and the power-supply voltage VDD is 3V for example, the resolution of the DAC 50 is expressed by the expression of $3V/(2^8-1)$=approximately 1.2 mV. In this case, based on the respective algorithms shown in FIGS. 4A to 4E, an electric potential of the output 26 from the analog output selection circuit 54 can be set with high accuracy over a wide range from the GND to the VDD.

The DAC 50 included in the microcomputer programmably outputs, in association with an intended purpose of a system, (i) a signal to the pad serving as the DAC output terminal, and (ii) a signal representing a result of the magnetic-field detection to the output 26. In other words, the DAC 50 can work not only as a DA convertor but also as a variable voltage circuit. Accordingly, the need for the variable voltage circuit 13 is eliminated, so that the magnetic-field detection microcomputer which is minimum and has high accuracy can be provided.

Here, in the output 25 shown in FIG. 6, the electric potential expressed by $VDD/2+(Vp-Vn)\times(R2/R1+1)$ is generated, as described above. Based on the second embodiment, the voltage of the output from the DAC 50 ($VDD/(2^n-1)\times$a DAC setting value) is generated in the output 26. Here, n is used for expressing n-bit DAC. If an arbitrary magnetic-field X[mT] is desired to be detected and the CPU 15 sets the value of the DAC 50 (DAC setting value) so that the below shown expression 1 is satisfied, the CPU 15 can detect the magnetic field X[mT].

$$VDD/2+(Vp-Vn)\times(R2/R1+1)>((VDD/(2^n-1))\times DAC \text{ setting value}) \quad \text{Expression 1}$$

Accordingly, the magnetic-field detection microcomputer 19A according to the second embodiment can easily set, for a plurality of magnetic field intensities, the magnetic-field detection by the DAC setting value based on the expression 1. As a result, a complicated analog circuit and the like is not required for detecting the magnetic field. The DAC setting value can be set for each of the samples by the algorithm shown in FIG. 5. Therefore, the process variation for each of the samples can be reduced, and multiple magnetic-field detection can surely and easily be achieved.

Third Embodiment

Figure 8:
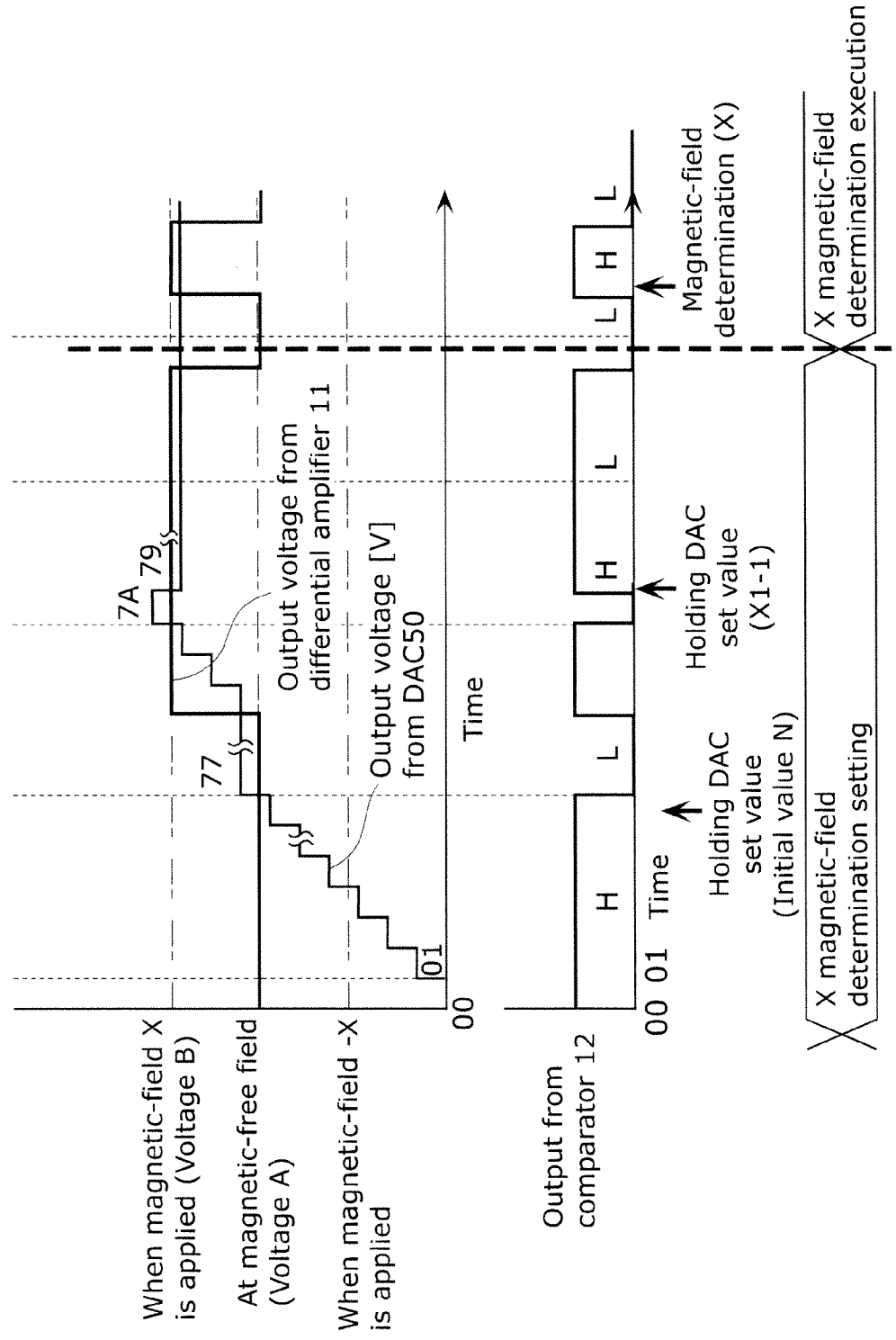
FIG. 8 shows a setting algorithm for the magnetic-field detection in a positive pole and an operation timing chart, when the north pole approaches to the magnetic-field detection microcomputer, according to a third embodiment of the present invention.
Figure 9:
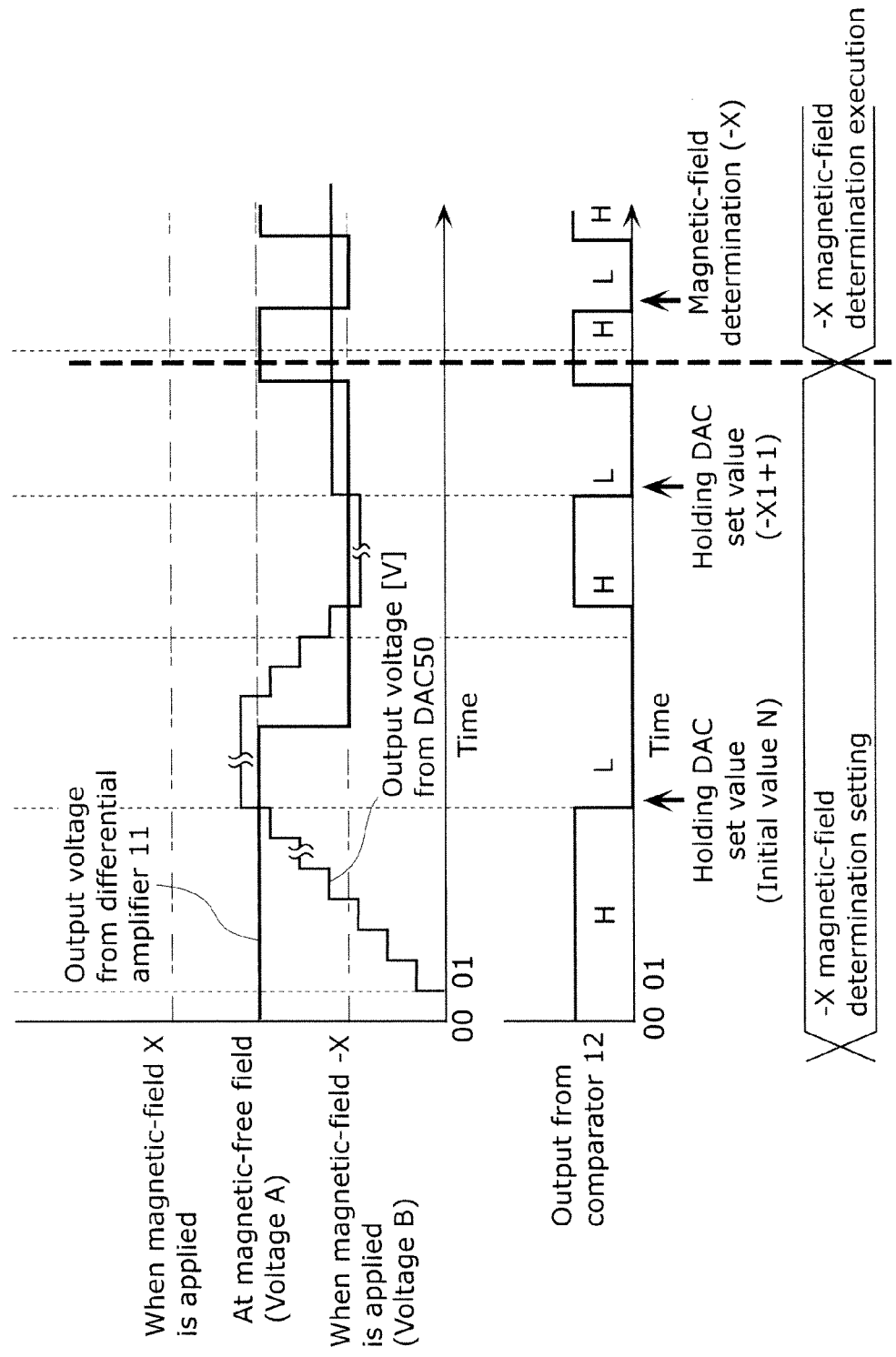
FIG. 9 shows a setting algorithm of the magnetic-field detection in a negative pole and an operation timing chart, when the magnetic-field detection microcomputer approaches the south pole, according to the third embodiment of the present invention.
Figure 10:
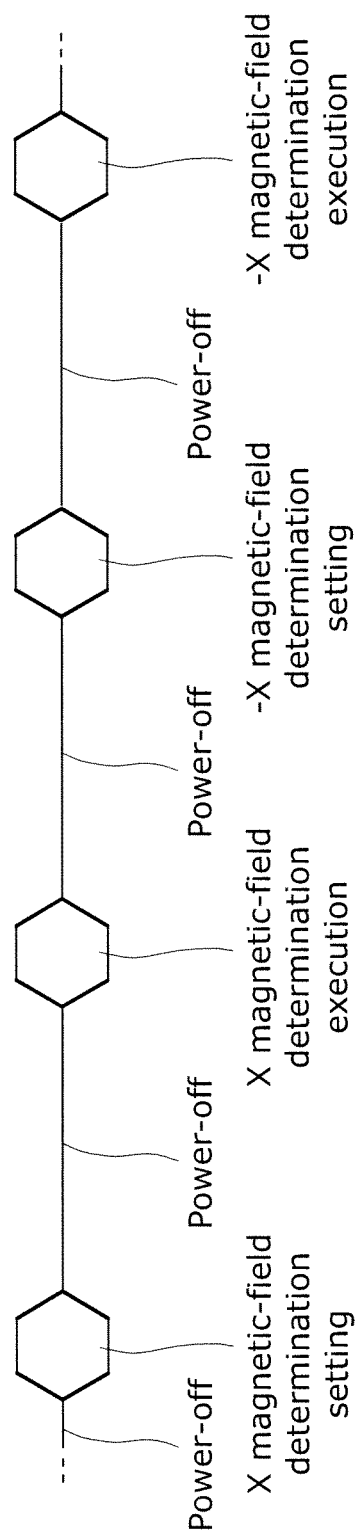
FIG. 10 is an execution sequence for a microcomputer to determine application of a north pole/south pole magnetic field according to the third embodiment of the present invention.

FIGS. 8, 9, and 10 show respective algorithms used for detecting the magnetic-field polarity of the magnetic-field detection microcomputer according to a third embodiment. Hereinafter, operation of the algorithms is described. The magnetic-field detection microcomputer according to the third embodiment is the magnetic-field detection microcomputer 19 according to the first embodiment.

The magnetic-field detection microcomputer 19 according to the third embodiment previously stores an intensity of the magnetic-field in the south pole, to be applied to the magnetic-field detection device 10, and a voltage control value indicating a condition under which the output from the comparator 12 is inverted. The first table (a table shown in FIG. 2A) previously stores an intensity of the magnetic-field in the north pole, to be applied to the magnetic-field detection device 10, and the voltage control value indicating the condition under which the output of the comparator 12 is inverted. The CPU 15 alternately performs the magnetic-field detection using the first table and the magnetic-field detection using the second table (a table shown in FIG. 2B), a predetermined number of times for each detection.

Hereinafter, specific processing is described which is performed by the magnetic-field detection microcomputer 19 according to the third embodiment.

Figure 7:
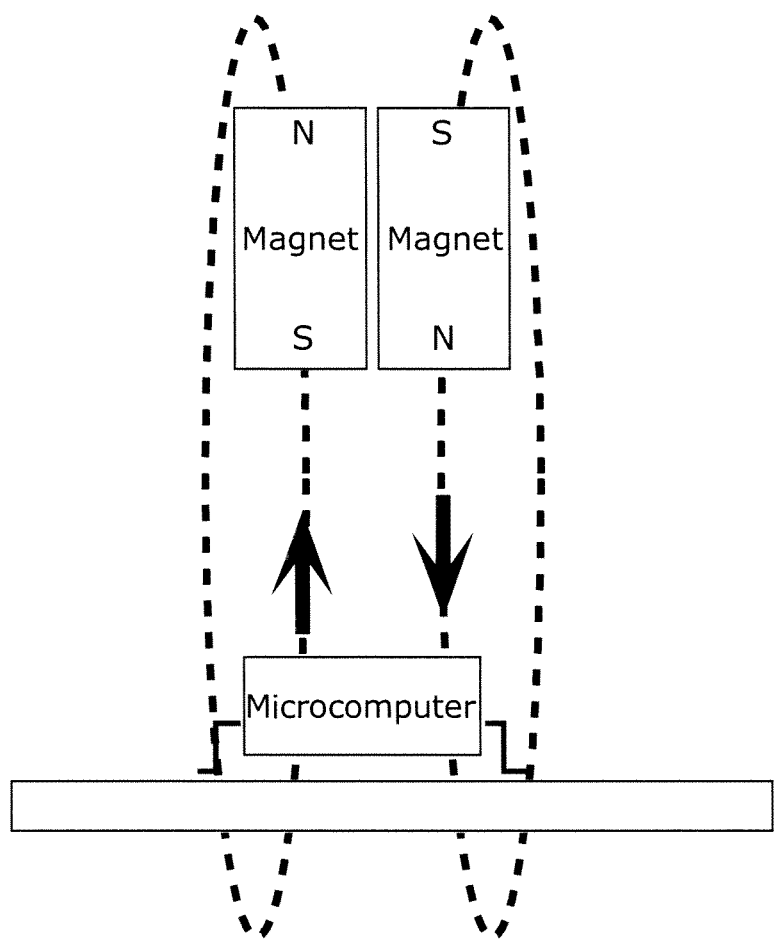
FIG. 7 is a diagram which shows a relationship between a microcomputer and a magnet.

FIG. 7 is a diagram which shows a relationship between the microcomputer including therein the magnetic-field detection device and a magnet. In FIG. 7, the magnetic field is perpendicularly applied to a planer surface of the microcomputer serving as a microcomputer chip. The microcomputer corresponds to a magnetic-field detection microcomputer (for example, magnetic-field detection microcomputer 19) to be described in each of the embodiments.

The magnetic-field detection microcomputer 19 according to the third embodiment previously stores the intensity of the magnetic-field in the south pole, to be applied to the magnetic-field detection device 10, and a voltage control value indicating a condition under which the output from the comparator 12 is inverted. The first table (the table shown in FIG. 2A) used in the third embodiment previously stores the intensity of the magnetic-field in the north pole, to be applied to the magnetic-field detection device 10, and the voltage control value indicating the condition under which the output from the comparator 12 is inverted.

When the north pole of the magnet approaches to the microcomputer, the magnetic-field having a positive polarity is generated, while when the south pole of the magnet approaches to the microcomputer, the magnetic-field having a negative polarity is generated. A method for detecting a magnetic-field direction shown in FIG. 7 is shown in FIGS. 8, 9, and 10. In the following description, the north pole and the south pole of the magnet are also referred to, simply, as N pole and S pole.

FIG. 8 shows a setting algorithm and an operation timing chart, which are for the positive pole magnetic-filed detection when N pole approaches to the microcomputer.

In the setting algorithm shown in FIG. 8, a magnetic-field detection determination table shown in FIG. 2A is created, for example. When the N pole approaches to the microcomputer, Vp>Vn is satisfied in terms of the relationship between voltages. Accordingly, the second term in the expression of $VDD/2+(Vp-Vn)\times(R2/R1+1)$ becomes positive, so that a voltage higher than VDD/2 is generated in the output 25.

The algorithm in the detection level in the third embodiment is same with that described in relation to FIG. 5. Therefore, if the output voltage (the output 51) of the DAC 50 for detecting the magnetic-field X[mT] is fixed, the magnetic field can be detected by the output X1-1 from the comparator 12, according to application of the magnetic-free field and the magnetic-field X[mT], as shown in FIG. 8.

FIG. 9 shows a setting algorithm of negative-pole magnetic-field detection, when the S pole approaches to the microcomputer. In the setting algorithm shown in FIG. 9, a magnetic-field detection determination table shown in FIG. 2B is created, for example.

Operation according to the third embodiment is described below. FIG. 9 shows the setting algorithm and timing chart same with those in FIG. 8, but in FIG. 9 -X[mT] which has the negative polarity is applied, while in FIG. 8 the X[mT] which has the positive polarity is applied. When the S pole approaches to the microcomputer, Vp<Vn is satisfied in terms of the relationship between the voltages. Therefore, the second term of the expression of $VDD/2+(Vp-Vn)\times(R2/R1+1)$ becomes negative. Accordingly, a voltage lower than the VDD/2 is generated in the output 25.

At this time, as shown in FIG. 9, the output voltage from the differential amplifier 11 is a voltage −B when the magnetic-field −X is applied to the magnetic-field detection device 10. The CPU 15 decrements a digital setting value of the register 4B of the variable voltage circuit 13 until the output 27 from the comparator 12 becomes H, and comparing operation is repeated.

When the output 26 from the variable voltage circuit 13 becomes a value smaller than the output 25, the output 27 from the comparator 12 is H. The CPU 15 holds a digital value obtained by adding 1 or more to the value of the register 4B of the voltage variation circuit 13 (i.e. the value immediately after the digital value) in the ROM 16, as −X1+1.

When the output voltage −X1+1 of the DAC 50 for detecting the magnetic-field −X[mT] is fixed, the CPU 15 can determine the N/S pole by the output 27 from the comparator 12, according to the application of the magnetic-free field and the magnetic-field −X[mT] to the magnetic-field detection device 10, as shown in FIG. 9.

Next, the N pole/S pole application determination microcomputer execution sequence is described, with reference to FIGS. 10 and 3. In order to determine whether or not the magnetic field in the N pole is applied to the magnetic-field detection device 10 (microcomputer), the CPU 15 causes the register 4B to hold the value of X1-1 written in the ROM 16 (Step S11), and performs determination on the X magnetic-field based on the operation shown in FIG. 3.

Next, in order to determine whether or not the magnetic field in the S pole is applied to the magnetic-field detection element 10 the CPU 15 causes the register 4B to hold the value of the −X1+1 written in the ROM 16, and performs determination on the −X magnetic-field based on the same operation as shown in FIG. 3. As shown in FIG. 10, the program in the microcomputer is executed in the time-sharing manner. The CPU 15 alternately performs the magnetic-field detection using the first table and the magnetic-field detection using the second table, a predetermined number of times for each detection.

Accordingly, the CPU 15 can determine whether or not the magnetic field in the N pole or in the S pole is applied to the magnetic-field detection device 10 (microcomputer).

It is needless to say that timing frequency in the time-sharing can optimally set by the program in association with a required set specification. A power-off state shown in FIG. 10 shows a state that the switches 30 and 31 of the magnetic-field detection device 10 are turned off. The power-off reduces a current flowing in the magnetic-field detection device 10.

According to the third embodiment, a direction (N pole/S pole) of the vertical magnetic field on a semiconductor substrate can be detected, and a plurality of desired the magnetic-field intensity can be detected.

Fourth Embodiment

Figure 13:
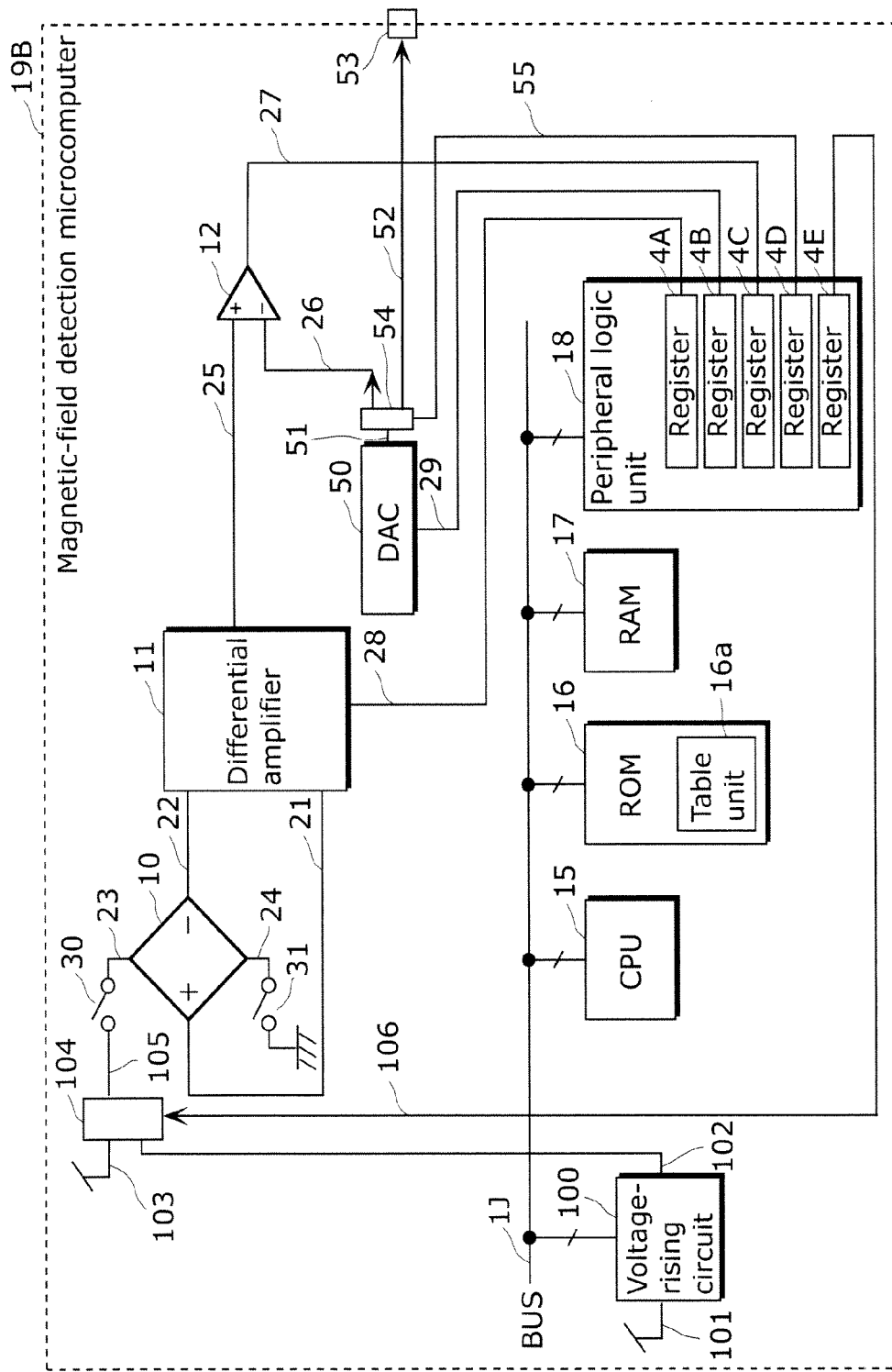
FIG. 13 is a block diagram which shows a magnetic-field detection microcomputer according to a fourth embodiment of the present invention.

FIG. 13 is a block diagram which shows a magnetic-field detection microcomputer 19B according to a fourth embodiment of the present invention.

The magnetic-field detection microcomputer 19B according to the fourth embodiment includes a voltage-raising circuit 100 which raises a voltage of a power-supply voltage, a voltage-switching circuit 104 which selects one of a power-supply voltage in which the voltage is raised and a power-supply voltage in which the voltage is not raised, and supplies the selected power-supply voltage to the magnetic-field detection device. The first table (the table shown in FIG. 2A) previously stores the magnetic-field intensity and the voltage control value, for each of the power-supply voltage in which the voltage is raised and the power-supply voltage in which the voltage is not raised. The CPU 15 detects the magnetic-field intensity using the voltage control value associated with the power-supply voltage selected by the voltage-switching circuit 104.

Next, a configuration of the magnetic-field detection microcomputer 19B and specific processing performed by the magnetic-field detection microcomputer 19B are described.

Hereinafter, for a configuration of the magnetic-field detection microcomputer 19B, a point different from the magnetic-field detection microcomputer 19A shown in FIG. 6 is mainly described.

As shown in FIG. 13, the magnetic-field detection microcomputer 19B further includes the voltage-raising circuit 100 and the voltage-switching circuit 104 which are not included in the magnetic-field detection microcomputer shown in FIG. 6. The voltage-raising circuit 100 raises the power-supply voltage.

The voltage-raising circuit 100 has a voltage-raised reference voltage 101 connected to the power-supply voltage VDD, and an output 102 which serves as an output signal after the voltage is raised, and is connected to one of inputs of the voltage-switching circuit 104. The input 103 of the voltage-switching circuit 104 is connected to the VDD.

The voltage-switching circuit 104 outputs, as an output 105, one of the output 102 and the input 103, according to a control signal 106. To be specific, the voltage-switching circuit 104 selects one of the power-supply voltage in which the voltage is raised and the power-supply voltage in which the voltage is not raised, and provides the selected power-supply voltage to the magnetic-field detection device. The control signal 106 is connected to a register 4E. In the register 4E, a value can be optionally set by the CPU 15.

A microcomputer having therein a liquid crystal display (LCD) function typically includes an LCD voltage-raising circuit for driving an LCD.

The LCD voltage-raising circuit may be used as the voltage-raising circuit 100. When the voltage-raising circuit 100 is a kth voltage-raising circuit, the output 102 has a potential of k×VDD. When the output 102 from the voltage-raising circuit 100 is selected as the power-supply voltage of the magnetic-field detection element 10, the selected value is set to the register 4E by the program of the microcomputer.

In the magnetic-field detection device 10, a voltage difference between the terminal 21 and terminal 22 increases in proportion to the power-supply voltage to be applied. When the power-supply voltage susceptibility coefficient of the magnetic-field detection device 10 is h, the output 25 becomes k×VDD/2+h(Vp−Vn)×(R2/R1+1) based on the expression 1. Accordingly, the output 25 (output voltage) increases by the coefficient h. This is beneficial when a minute magnetic-field is detected. If an arbitrary minute magnetic-field ΔX[mT] is to be detected, the CPU 15 sets a value of the DAC 50 (DAC setting value) so that the below shown expression 2 is satisfied when the magnetic-field ΔX[mT] is applied, thereby detecting the minute magnetic-field ΔX[mT]. The CPU 15 detects the magnetic-field intensity using the voltage control value corresponding to the power-supply voltage selected by the voltage-switching circuit 104.

$$K \times VDD/2 + h(Vp-Vn)/(R2/R1+1) > ((VDD/(2^n-1)) \times DAC \text{ setting value}) \quad \text{Expression 2}$$

Fifth Embodiment

Figure 14:
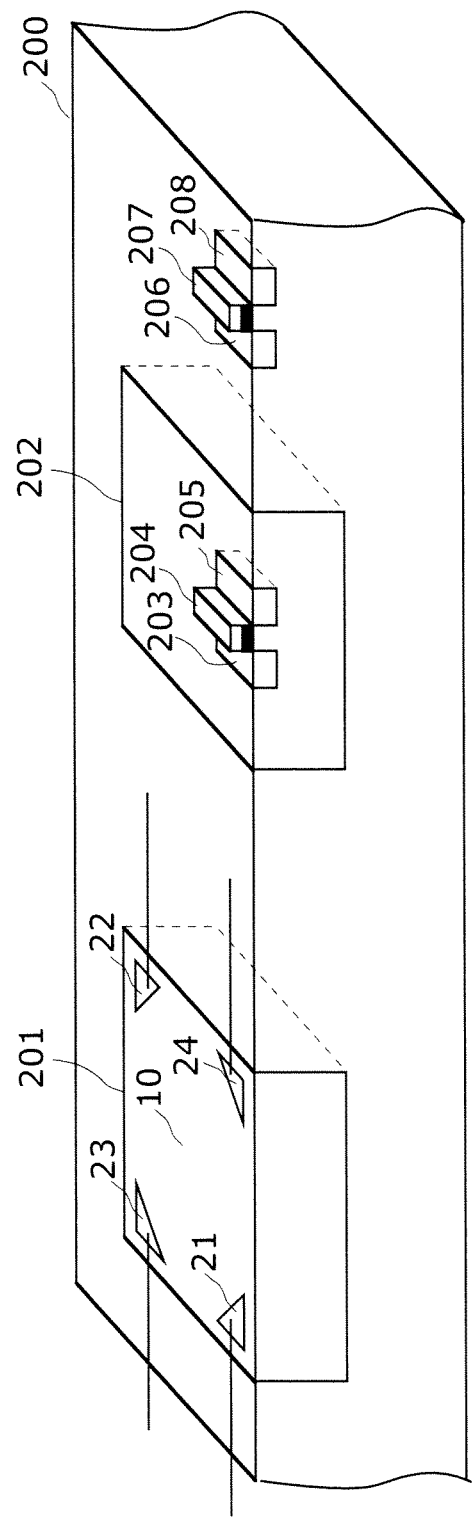
FIG. 14 is a perspective view which shows a semiconductor substrate used for a magnetic-field detection microcomputer according to a fifth embodiment of the present invention.

FIG. 14 is a perspective view which shows a semiconductor substrate 200 used for a magnetic-field detection microcomputer according to a fifth embodiment of the present invention
The magnetic-field detection microcomputer according to the fifth embodiment may be any one of the magnetic-field microcomputers 19, 19A, and 19B.

The magnetic-field detection device 10, the differential amplifier 11, the variable voltage circuit 13, the comparator 12, the voltage controlling register (the register 4B), the storage unit (the ROM 16), and the CPU 15 are formed on the single semiconductor substrate 200.

It should be noted that FIG. 14 shows only a part of the structural components formed in the semiconductor substrate 200 among all of the structural components included in the magnetic-field detection microcomputer. For example, FIG. 14 does not show the differential amplifier 11, the variable voltage circuit 13, the comparator 12, the register 4B, the ROM 16, the CPU15, and the like.

Hereinafter, a configuration of the semiconductor substrate 200 is described in detail.

The semiconductor substrate 200 is a P-type substrate. It should be noted that the semiconductor substrate 200 is not limited to the P-type substrate, but may be an N-type substrate.

In the semiconductor substrate 200, the magnetic-field detection device 10 is formed.

In addition, in the semiconductor substrate 200, N wells 201 and 202 are formed. The N well 201 has four corners, and in the respective corners, the terminals 21, 22, 23, and 24 are formed. From each one of the terminals 21, 22, 23, and 24, an electrode can be drawn out.

To be specific, in the semiconductor substrate 200, the magnetic-field detection device 10 serving as a hall element is formed. Accordingly, the magnetic-field detection device 10 is the hall element.

In the N well 202, a source 203 doped into the P-type as a P channel transistor, a drain 205, and a gate 204 are formed. In the semiconductor substrate 200, a source 208 doped into the N-type as an N channel transistor, a drain 206, and a gate 207 are formed.

The N well 202 which forms the P channel transistor and the N well 201 which forms the hall element are formed by a same type of N well.

The N well 202 is an N well which forms a fine complementary metal-oxide semiconductor (CMOS), and concentration of the N well 202 is appropriate to a fine process.

Typically, the susceptibility of the hall element is in proportion to a carrier mobility $\mu$, and the lower the concentration of the N well is, the higher the carrier mobility $\mu$ becomes. Therefore, in order to enhance the susceptibility of the hall element, the concentration of the N well is appropriately adjusted so that the carrier mobility $\mu$ increases in a single-body hall element and a single-body hall IC.

However, when the hall element is formed in the substrate also used for the microcomputer, with the fine CMOS process also executed in the microcomputer, the hall element should be formed with the concentration of the N well formed by the fine CMOS. Accordingly, it is generally more difficult to enhance the susceptibility of a built-in hall element (the magnetic-field detection device 10) than to enhance a single hall element or a single hall IC which are formed using an optimal process.

However, if the magnetic-field detection microcomputer shown in FIG. 1, 6, or 13 and the magnetic-field detection setting algorithms shown in FIG. 5 and so on are used, a gain of the differential amplifier 11 can be increased by varying the resistance of the reference resistor R2 using the control signal 28 to the differential amplifier 11.

Furthermore, the control signal 29 of the voltage variation circuit 13 is optionally set by the program of the microcomputer, thereby enabling the sample variation to be reduced. The susceptibility of the hall element (the magnetic-field detection element 10) can be enhanced by the voltage-raising circuit 100, and the temperature characteristics variation can be reduced at the time of delivery inspection of the microcomputer. Accordingly, if the N well on the fine CMOS is used, decrease of the susceptibility in the magnetic field can be compensated and the magnetic-field detection can be surely achieved.

As mentioned above, it has been conventionally difficult to achieve the hall element or the hall IC with the microcomputer in a single process. However, these can be achieved on a single substrate with a single process, thereby achieving the magnetic-field detection microcomputer having a small area at a low cost.

Particularly, in a non-volatile flash microcomputer, a high-voltage transistor is mounted in many cases, rather than a usual volatile CMOS mask ROM microcomputer. In such a case, it is further effective to form the hall element using the N well in which the susceptibility of the hall element increases, i.e., the N well forming a high pressure element in which the carrier mobility $\mu$ increases.

Sixth Embodiment

Figure 15:
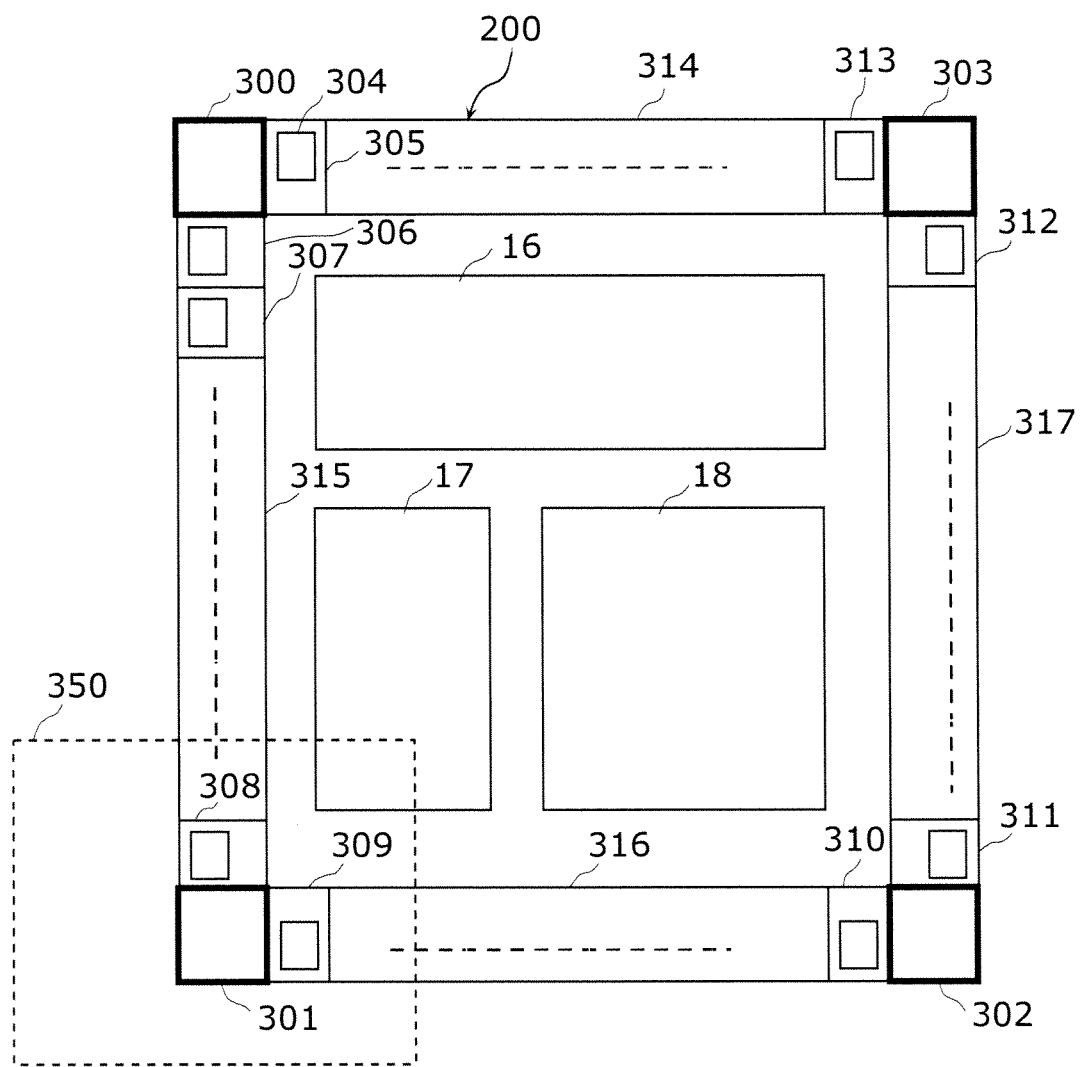
FIG. 15 is a layout chart which shows a magnetic-field detection microcomputer according to a sixth embodiment of the present invention.

FIG. 15 is a semiconductor layout chart which shows a magnetic-field detection microcomputer, according to a sixth embodiment of the present invention. Each of structural components shown in FIG. 15 is formed on the semiconductor substrate 200.

At respective four corners (on respective corner cells) of the semiconductor substrate 200, hall element units 300, 301, 302, and 303 are formed.

Each of the hall element units 300, 301, 302, and 303 is a part (area) in which the magnetic-field detection device 10 serving as a hall element is formed.

At each of regions 314, 315, 316, and 317 respectively sandwiched by the hall element units 300 and 303, 300 and 301, 301 and 302, and 302 and 303, input-output (IO) cells 305, 306, 307, 308, 309, 310, 311, 312, and 313 are arranged.

In each of the IO cells 305, 306, 307, 308, 309, 310, 311, 312, and 313, a pad 304 is provided. A region surrounded by the regions 314, 315, 316, and 317 is a circuit region in which the ROM 16, the RAM 17, the peripheral logic unit 18, and so on are formed. The circuit region is formed by a standard cell.

Figure 16:
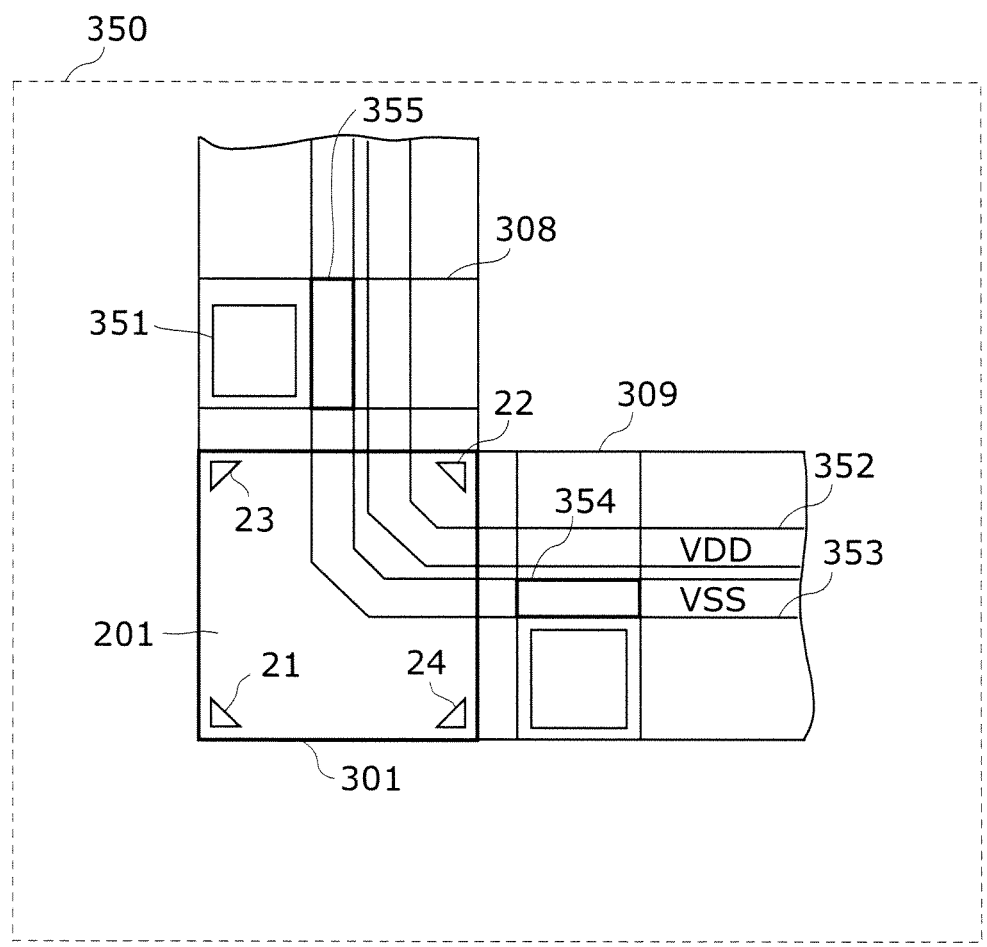
FIG. 16 is a layout chart which shows, in detail, a region surrounded by a dotted-line in FIG. 15.

Next, with respect to a region 350 shown in FIG. 15, a layout is described in detail, referring to FIG. 16.

In FIG. 16, power-supply lines 352 and 353 are shown which are respectively for the IO cells 308 and 309 shown in FIG. 15. The power-supply line 352 is used for supplying the voltage VDD. The power-supply line 353 is used for supplying the voltage VSS.

The power-supply lines 352 and 353 are respectively connected to the IO cells 308 and 309 as a power source. The power-supply lines 352 and 353 are arranged so as not to cross the terminals 21, 22, 23, and 24 of the hall element unit 301.

FIG. 16 shows the N well 201 of the hall element unit 301, an N well 354 for the IO cell 305, an N well 355 for the IO cell 309.

Thus, a corner cell region surrounded by the IO cell 308 and the IO cell 309 is typically provided only with the power-supply lines 352 and 353, and is a free space. Other three corner cells among four corners of the semiconductor substrate 200 shown in FIG. 15 are formed in the same manner as the corner cell region surrounded by the IO cells 308 and 309.

The N well 201 is provided in the free space, and connected by the terminals 21, 22, 23, and 24 which serve as electrodes, thereby enabling the magnet-field detection device 10 to be formed in the hall element unit 301.

With this configuration, when the magnetic-field detection device 10 shown in FIG. 1 is formed by the hall element, the magnet-field detection device 10 can be formed on a single chip without increasing an area of the hall element, thereby reducing a cost.

The hall element (the magnetic-field detection device 10) can be arranged, on the single chip, at the four corners which are furthest places from circuits to be noise sources for the magnetic-field detection device 10 (sensor) serving as the hall element. Accordingly, the magnetic-field detection device 10 is beneficially insusceptible to noises during operation of the microcomputer.

In the sixth embodiment, the magnetic-field detection device 10 serving as the hall element is formed in each of the four corners of the semiconductor substrate 200. The hall element is not limited to be formed in all of the four corners of the semiconductor substrate 200. The hall element may be, for example, formed in only one corner among four corners of the semiconductor substrate 200. In other words, the magnetic-field detection device 10 serving as the hall element is formed at least one corner among the four corners of the semiconductor substrate 200.

Seventh Embodiment

Figure 17:
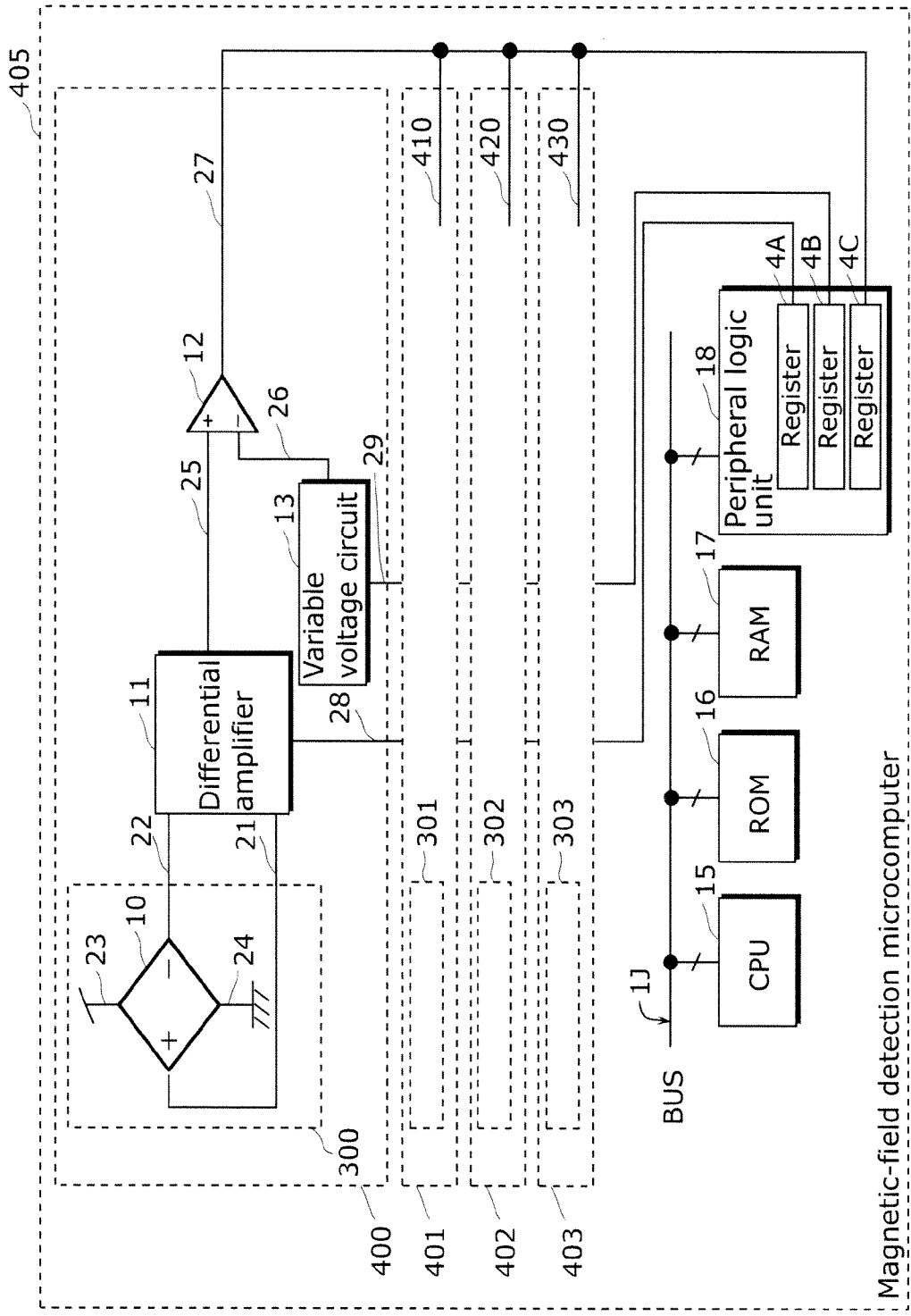
FIG. 17 is a block diagram which shows a magnetic-field detection microcomputer according to a seventh embodiment of the present invention.

FIG. 17 is a block diagram which shows a magnetic-field detection microcomputer 405 according to a seventh embodiment of the present invention.

As shown in FIG. 17, the magnetic-field detection microcomputer 405 includes magnetic-field detection circuit blocks 400, 401, 402, and 403, the CPU 15, the ROM 16, the RAM 17, and the peripheral logic unit 18.

The magnetic-field detection circuit block 400 includes the magnetic-field detection device 10 serving as a hall element, the differential amplifier 11, the comparator 12, the variable voltage circuit 13, and the control signals 28 and 29, which are shown in FIG. 1. The connecting configuration among the magnetic-field detection device 10, the differential amplifier 11, the comparator 12, the variable voltage circuit 13 and so on is the same with that among components shown in FIG. 1.

The configuration of each of the magnetic-field detection circuit blocks 401, 402, and 403 is same with that of the magnetic-field detection circuit block 400.

The magnetic-field detection microcomputer 405 includes, in addition to the magnetic-field detection circuit block 401, three magnetic-field detection devices 10 mutually having the same configuration and three sets each including the differential amplifier 11, the voltage variation circuit 13, and the comparator 12. The CPU 15 detects the magnetic field using the respective four sets (magnetic-field detection circuit blocks 400, 401, 402, and 403).

Each of the magnetic-field detection circuit blocks 400, 401, 402, and 403 includes hall element units 300, 301, 302, and 303. The output from the hall element unit 300 corresponds to the output 27. The outputs from the hall element units 301, 302, and 303 respectively correspond to the outputs 410, 420, and 430.

The hall element units 300, 301, 302, and 303 are arranged in the respective four corners of the semiconductor substrate 200, as described with reference to FIG. 15. In each of the hall element units 300, 301, 302, and 303, the magnetic-field detection device 10 is formed. Specifically, four magnetic-field detection devices 10 are arranged in the respective four corners of the semiconductor substrate 200.

With this configuration, the hall element units 300, 301, 302, and 303 are arranged in the respective four corner cells which are free spaces on the semiconductor substrate 200. Thus, an area for placing the hall element unit can be reduced.

The hall element units 300, 301, 302, and 303 can be arranged in a diagonally outermost frame of the semiconductor substrate 200. Accordingly, the CPU 15 can susceptibly detect the direction of the magnetic field.

Figure 18:
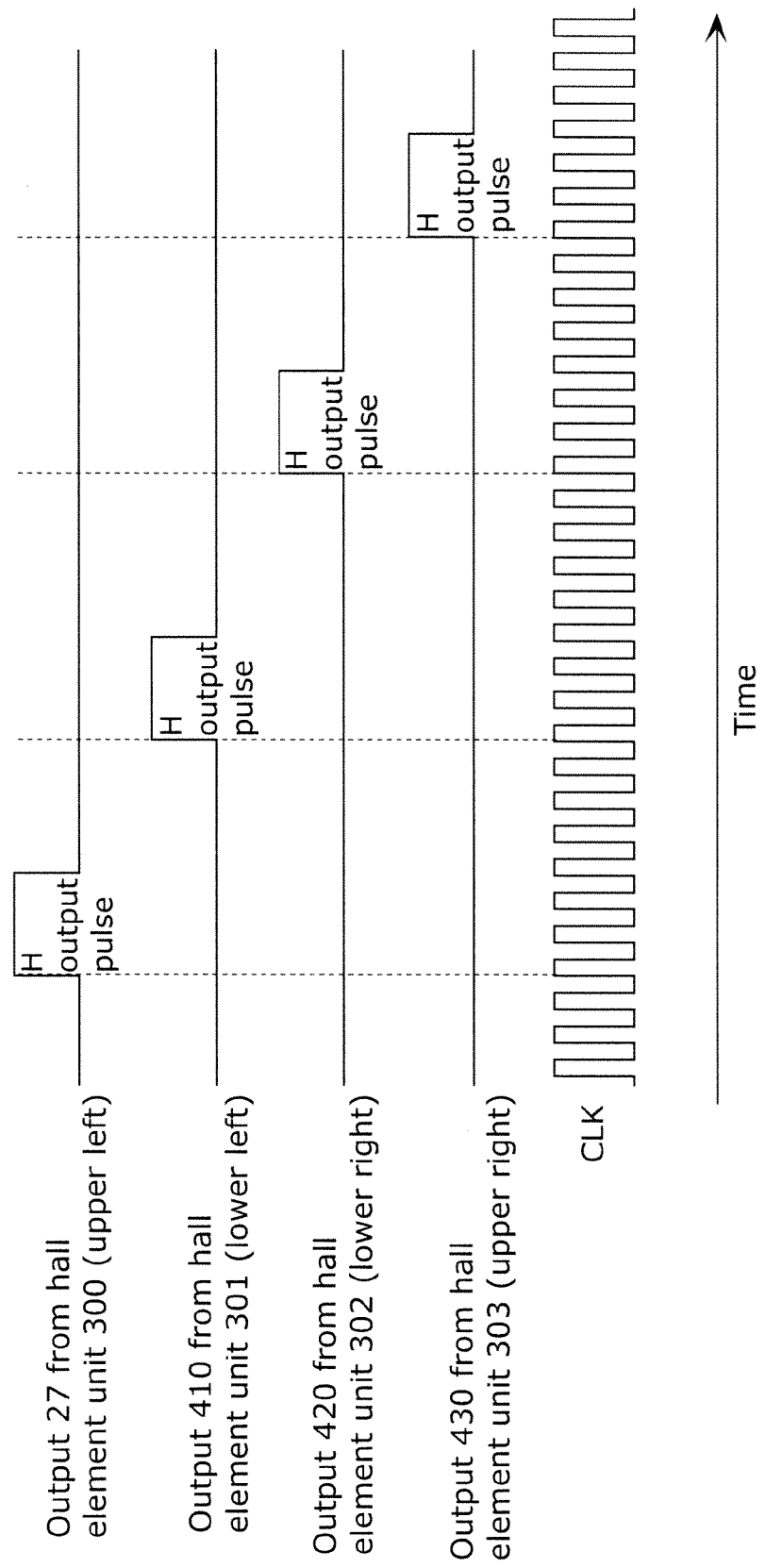
FIG. 18 is an operation timing chart for a magnetic-field detection microcomputer according to a seventh embodiment of the present invention.
Figure 19:
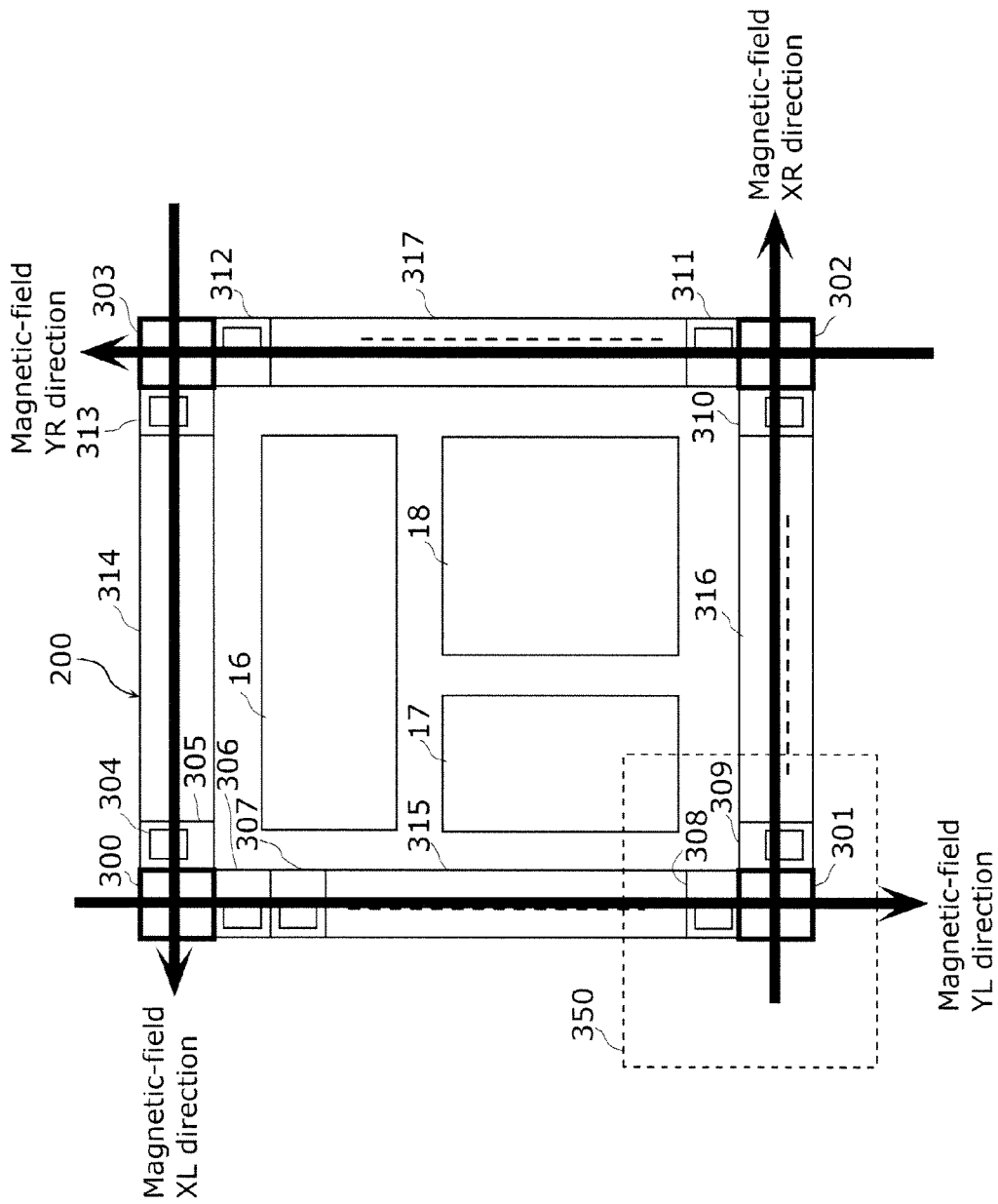
FIG. 19 is a layout chart which shows a semiconductor used in the magnetic-field detection microcomputer according to the seventh embodiment of the present invention, and shows a state that a magnetic-field is applied.

The above is described, referring to FIG. 18 showing an operation timing chart and FIG. 19 showing a state in which the magnetic field is applied. The outputs 27, 410, 420, and 430 shown in FIG. 18 respectively corresponds to the outputs 27, 410, 420, and 430 in the hall element units 300, 301, 302, and 303 which are shown in FIGS. 15 and 17.

It is assumed that the magnetic field is detected by outputting an H pulse at a timing of an H output pulse shown in FIG. 18, i.e., at a timing when a perpendicular magnetic field achieves a desired magnetic-field intensity on each of the hall elements. FIG. 19 is a diagram in which directions YL, XR, YR, and XL of the magnetic field is added to the semiconductor substrate 200 shown in FIG. 15.

In FIG. 18, when the CPU 15 detects the magnetic fields in the order of the output 27 and the output 410, the direction of the magnetic field is the magnetic field YL direction which is shown in FIG. 19. When the CPU 15 detects the magnetic fields in the order of the output 410 and the output 27, the direction of the magnetic field is the magnetic field XR direction which is shown in FIG. 19.

When the CPU 15 detects the magnetic fields in the order of the output 420 and the output 430, the direction of the magnetic field is the magnetic field YR direction which is shown in FIG. 19. When the CPU 15 detects the magnetic fields in the order of the output 430 and the output 27, the direction of the magnetic field is the magnetic field XL direction which is shown in FIG. 19. The direction of the magnetic field appears as a phase on a time axis by the intensity of the perpendicular magnetic field on a surface of the hall element.

CLK in FIG. 18 denotes a clock of the microcomputer, and the CLK is counted by a timer counter included in the peripheral logic unit 18, thereby detecting a phase difference. The CPU 15 can detect the magnetic-field directions YL, XR, YR, and XL by controlling the microcomputer, as described above.

It is needless to say that an optimal detection state can be set, upon the magnetic-field detection, by setting the voltage-raising circuit 100, an amplification degree of the differential amplifier 11, and the variable voltage circuit 13 to have respective optimal values.

According to the seventh embodiment, an area for arranging the hall element unit can be reduced, so that the microcomputer can be made into a single chip with the hall element using an existing microcomputer process. In other words, the existing manufacturing process for the microcomputer can be used for enabling the hall element and the microcomputer to be made into a single chip.

The directions of the magnetic field in a horizontal direction of the semiconductor substrate (the X-direction of an upper side of the semiconductor substrate, the Y-direction of a left side of the semiconductor substrate, the X-direction of a lower side of the semiconductor substrate, and the Y-direction of a right side of the semiconductor substrate) can be detected, thereby providing a magnetic-field detection microcomputer at a low cost. Therefore, reduction of an offset error in the hall element for each of the samples, and reduction of the temperature characteristics can be achieved with a minimum area at a low cost.

In the seventh embodiment, detection accuracy in the magnetic-field direction can be enhanced by additionally arranging the hall element not only at the four corners on the single chip, but at an arbitrary place in an IO band. In addition, a square is particularly effective for a chip to be used, because the square is a unified condition for the respective hall elements in the four corners. Therefore, the semiconductor substrate 200 is preferably made in a square.

With each of embodiments, a sample-variation error in a sensor can be reduced by minimum units. A direction of the vertical magnetic field (N pole/S pole) on the semiconductor substrate 200 can be detected, and a plurality of desired magnetic-field intensity can be detected. Furthermore, the area for providing the hall element unit can be reduced, so that the microcomputer can be made into a single chip together with the hall element using the existing microcomputer processing. Furthermore, the directions of the magnetic field in the horizontal direction on the semiconductor substrate 200 (the X-direction of the upper side of the semiconductor substrate, the Y-direction of the left side of the semiconductor substrate, the X-direction of the lower side of the semiconductor substrate, and the Y-direction of the right side of the semiconductor substrate) can be detected, thereby providing the magnetic-field detection microcomputer at a low cost.

[Functional Block Diagram]

Figure 20:
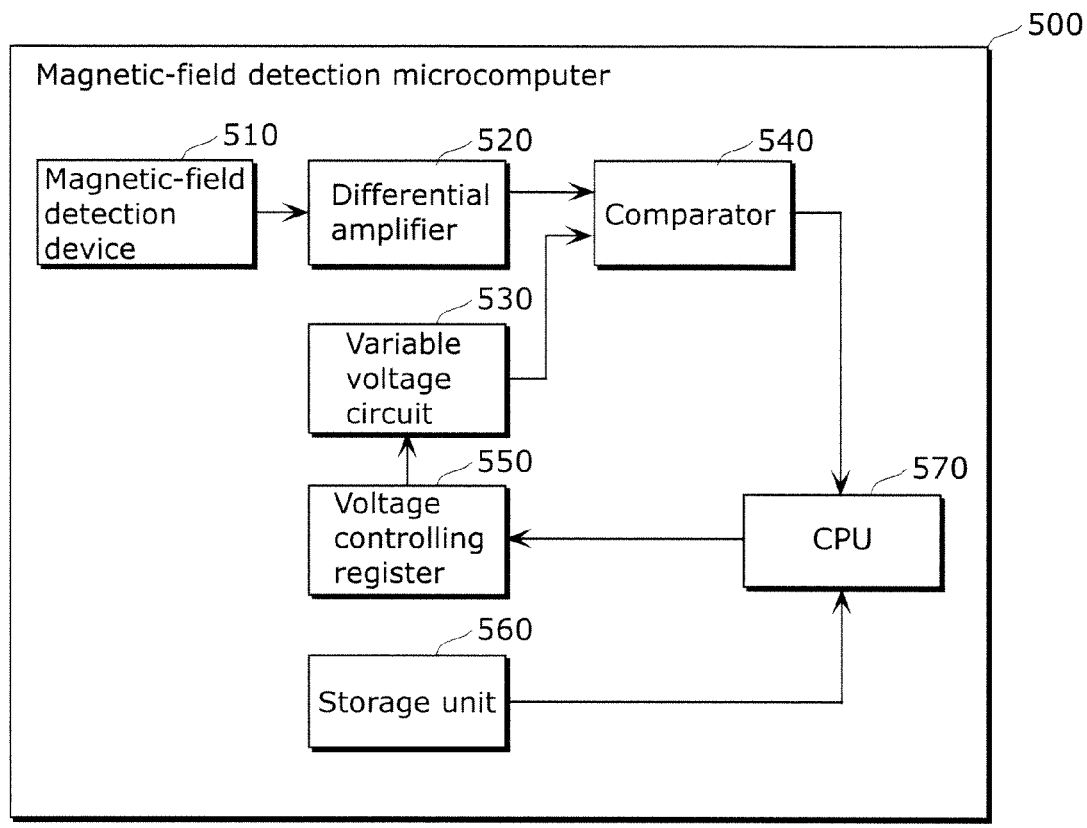
FIG. 20 is a block diagram which shows a functional composition typical of the magnetic-field detection microcomputer.
Figure 21:
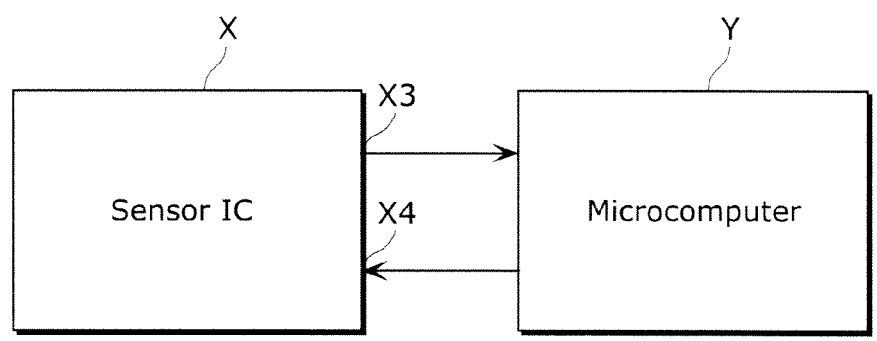
FIG. 21 is a diagram which shows a sensor IC and a microcomputer according to a conventional technique.
Figure 22:
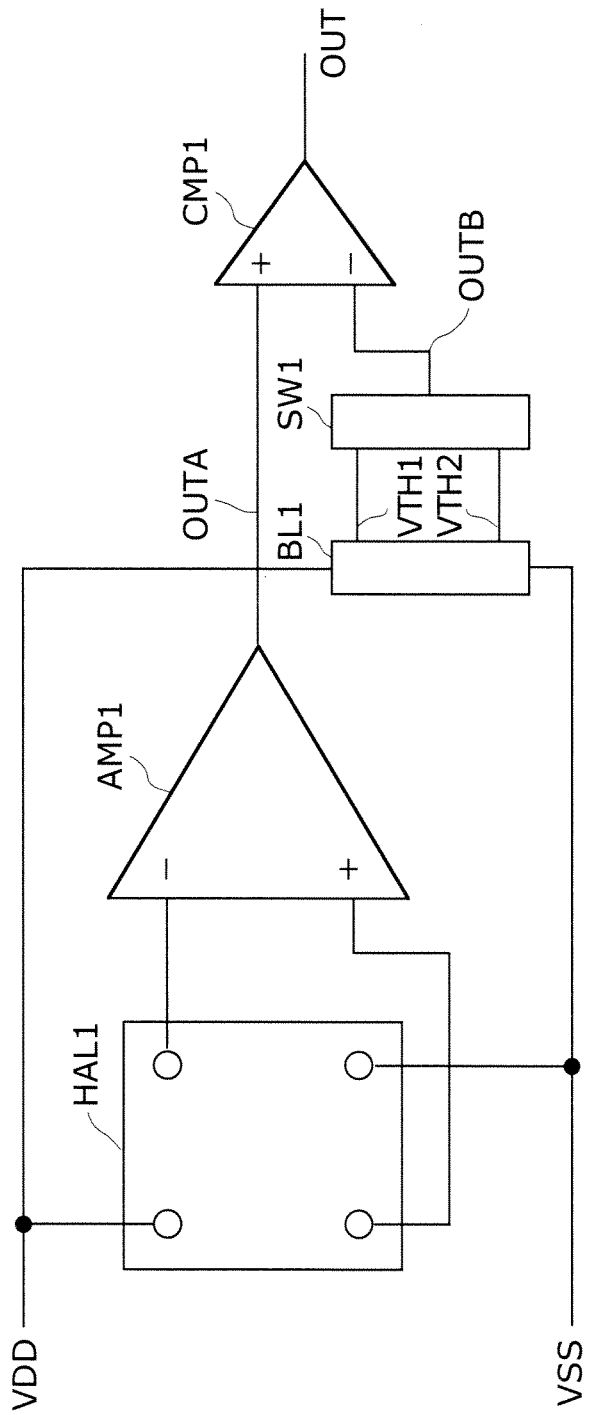
FIG. 22 is a diagram which shows a magnetic-field detection circuit according to the conventional technique.

FIG. 20 is a block diagram which shows a functional composition typical of a magnetic-field detection microcomputer 500. The magnetic-field detection microcomputer 500 corresponds to any one of the aforementioned magnetic-field detection microcomputers 19, 19A, 19B, and 405. Thus, FIG. 20 is a block diagram which shows a primary function according to an aspect of the present invention, among functions included any one of the magnetic-field detection microcomputers 19, 19A, 19B, and 405.

The magnetic-field detection microcomputer 500 includes a magnetic-field detection device 510, a differential amplifier 520, a variable voltage circuit 530, a comparator 540, a voltage controlling register 550, a storage unit 560, and a CPU 570.

The magnetic-field detection device 510 is used for detecting a magnetic field. The magnetic-field detection device 510 corresponds to the magnetic-field detection device 10.

The differential amplifier 520 amplifies an output voltage from the magnetic-field detection device 510. The differential amplifier 520 corresponds to the differential amplifier 11.

The variable voltage circuit 530 generates, according to a voltage control signal (the control signal 29), a reference voltage that is variable. The variable voltage circuit 530 corresponds to the variable voltage circuit 13 or the DAC 50.

The comparator 540 compares the output from the differential amplifier 520 and the reference voltage generated by the variable voltage circuit 530. Then, the comparator 540 outputs the result of the comparison. The comparator 540 corresponds to the comparator 12. The results of the comparison output from the comparator 540 correspond to the output 27.

The voltage controlling register 550 holds a voltage control value, and outputs the voltage control signal having the voltage control value to the variable voltage circuit 530. The voltage control value is a value for controlling a level of the reference voltage generated by the variable voltage circuit. The voltage controlling register 550 corresponds to the register 4B.

The storage unit 560 previously stores a first table in which the magnetic-field intensity that is an intensity of the magnetic field applied to the magnetic-field detection device 510 and the voltage control value immediately before or after an output from the comparator 540 is inverted when the voltage control value is increased or decreased, are associated with each other. The storing unit 560 corresponds to the ROM 16. The first table corresponds to, for example, the magnetic-field detection determination table shown in FIG. 2A.

The CPU 570 sets, to the voltage controlling register 550, the voltage control value corresponding to a magnetic field to be detected. The CPU 570 determines whether or not the magnetic-field intensity associated with the voltage control value exists based on the result of the comparison by the comparator 540 and the first table. The CPU 570 corresponds to the CPU 15.

All of or a part of components of the magnetic-field detection microcomputer 500, such as the differential amplifier 520, the variable voltage circuit 530, the comparator 540, the voltage controlling register 550, the storage unit 560, and the CPU 570, may be formed by a hardware, such as an LSI.

Although the magnetic-field detection microcomputer according to an aspect of the present invention is described based on the embodiments, the present invention is not limited to these embodiments. Modifications made by applying variations which a person skilled in the art is conceivable to the embodiments, and an embodiment in which structural components in the different embodiments are combined, are also included in the scope of the present invention without departing from the scope of the invention.

The present invention may be achieved as a magnetic-field detecting method including, as a step, a function of a distinguishing component included in the magnetic-field detection microcomputer according to the respective embodiments. The present invention may be achieved as a program used for causing a computer to execute respective steps included in the magnetic-field detecting method. The present invention may be achieved as a computer readable recording medium which stores such a program. The program may be delivered via a transmission medium, such as the Internet.

The disclosed embodiments are an example in view of all aspects, and should not be considered as limitary description. The scope of the present invention is indicated not by the aforementioned description but by the scope of claims, and is intended to include meaning equivalent to the scope of the claims and all modification within the scope.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention does not require a variable voltage circuit having a complicated configuration, and thus is useful as a magnetic-field detection microcomputer capable of easily determining a presence or absence of a magnetic-field intensity.

The invention claimed is:

1. A magnetic-field detection microcomputer comprising:
a magnetic-field detection device which detects a magnetic field;

a differential amplifier which amplifies an output voltage from the magnetic-field detection device;
a variable voltage circuit which generates, according to a voltage control signal, a reference voltage that is variable;
a comparator which compares an output from the differential amplifier with the reference voltage generated by the variable voltage circuit;
a voltage controlling register which holds a voltage control value for controlling a level of the reference voltage generated by the variable voltage circuit, and outputs the voltage control signal having the voltage control value to the variable voltage circuit;
a storage unit configured to previously store a first table in which a magnetic-field intensity indicating an intensity of the magnetic field to be applied to the magnetic-field detection device and the voltage control value are associated with each other; and
a central processing unit (CPU) configured to set, to the voltage controlling register, the voltage control value corresponding to a magnetic field to be detected, and to determine presence or absence of the magnetic-field intensity associated with the voltage control value based on a result of the comparison by the comparator and the first table.

2. The magnetic-field detection microcomputer according to claim 1, further comprising
a gain controlling register which holds one or more gain control values each for setting a gain of the differential amplifier, and outputs a gain control signal having a corresponding one of the gain control values to the differential amplifier,
wherein the differential amplifier is capable of varying the gain according to the gain control signal, and
the storage unit is configured to previously store the first table in which the magnetic-field intensity and the voltage control value are associated with each other, for each of the gain control values.

3. The magnetic-field detection microcomputer according to claim 1,
wherein the CPU is configured to increase or decrease the voltage control value held in the voltage controlling register, and to read out the magnetic-field intensity associated with the voltage control value from the first table as the detected magnetic-field intensity, when an output from the comparator is inverted.

4. The magnetic-field detection microcomputer according to claim 1,
wherein the variable voltage circuit is a digital-to-analog (D/A) converter.

5. The magnetic-field detection microcomputer according to claim 1,
wherein the storage unit is further configured to previously store: (i) a second table in which an intensity of a magnetic-field in a south pole to be applied to the magnetic-field detection device and the voltage control value indicating a condition under which the output from the comparator is inverted, are associated with each other; and (ii) the first table in which an intensity of a magnetic-field in a north pole to be applied to the magnetic-field detection device and the voltage control value indicating the condition under which the output from the comparator is inverted, are associated with each other.

6. The magnetic-field detection microcomputer according to claim 5,
wherein the CPU is configured to alternately perform magnetic-field detection using the first table and magnetic-field detection using the second table, a predetermined number of times for each of the magnetic-field detection.

7. The magnetic-field detection microcomputer according to claim 1, further comprising:
a voltage-raising circuit which raises a power-supply voltage; and
a voltage-switching circuit which selects one of the power-supply voltage in which the voltage is raised and the power-supply voltage in which the voltage is not raised, so as to supply the selected power-supply voltage to the magnetic-field detection device,
wherein the storage unit is configured to previously store the first table in which the magnetic-field intensity and the voltage control value are associated with each other, for each of the power-supply voltage in which the voltage is raised and the power-supply voltage in which the voltage is not raised, and
the CPU is configured to detect the magnetic-field intensity using the voltage control value corresponding to the power-supply voltage selected by the voltage-switching circuit.

8. The magnetic-field detection microcomputer according to claim 1,
wherein the magnetic-field detection device is a hall element, and
the magnetic-field detection device, the differential amplifier, the variable voltage circuit, the comparator, the voltage controlling register, the storage unit, and the CPU are formed in a single semiconductor substrate.

9. The magnetic-field detection microcomputer according to claim 8,
wherein the hall element is formed in at least one corner among four corners of the semiconductor substrate.

10. The magnetic-field detection microcomputer according to claim 8, further comprising:
three magnetic-field detection devices each having the same configuration as a configuration of the magnetic-field detection device; and
three sets each having the same configuration as a configuration of a set which includes the differential amplifier, the variable voltage circuit and the comparator,
wherein the four magnetic-field detection devices are placed in the respective four corners of the semiconductor substrate, and
the CPU is configured to detect the magnetic field using the four sets.

11. A magnetic-field detecting method performed by a magnetic-field detection microcomputer including:
a magnetic-field detection device which detects a magnetic field;
a differential amplifier which amplifies an output voltage from the magnetic-field detection device;
a variable voltage circuit which generates, according to a voltage control signal, a reference voltage that is variable;
a comparator which compares an output from the differential amplifier with the reference voltage generated by the variable voltage circuit;
a voltage controlling register which holds a voltage control value for controlling a level of the reference voltage generated by the variable voltage circuit, and outputs the voltage control signal having the voltage control value to the variable voltage circuit; and
a storage unit configured to previously store a first table in which a magnetic-field intensity indicating an intensity of the magnetic field to be applied to the magnetic-field detection device and the voltage control value are associated with each other, the magnetic-field detecting method comprising:

setting, to the voltage controlling register, the voltage control value corresponding to the magnetic field to be detected;

determining whether or not an output from the comparator is inverted; and reading out the magnetic-field intensity associated with the voltage control value from the first table, when in the determining, the output from the comparator is determined to be inverted.

* * * * *